(12) United States Patent
Weber et al.

(10) Patent No.: US 11,398,478 B2
(45) Date of Patent: Jul. 26, 2022

(54) SEMICONDUCTOR NANOWIRE DEVICE HAVING (111)-PLANE CHANNEL SIDEWALLS

(71) Applicant: Intel Corporation, Santa Clara, CA (US)

(72) Inventors: Cory E. Weber, Hillsboro, OR (US); Harold W. Kennel, Portland, OR (US); Willy Rachmady, Beaverton, OR (US); Gilbert Dewey, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/772,101

(22) PCT Filed: Mar. 22, 2018

(86) PCT No.: PCT/US2018/023753
§ 371 (c)(1),
(2) Date: Jun. 11, 2020

(87) PCT Pub. No.: WO2019/182596
PCT Pub. Date: Sep. 26, 2019

(65) Prior Publication Data
US 2021/0074703 A1 Mar. 11, 2021

(51) Int. Cl.
*H01L 27/092* (2006.01)
*H01L 29/78* (2006.01)
(Continued)

(52) U.S. Cl.
CPC .......... *H01L 27/0922* (2013.01); *H01L 21/02* (2013.01); *H01L 21/8238* (2013.01);
(Continued)

(58) Field of Classification Search
CPC ............. H01L 27/0922; H01L 27/0924; H01L 27/092; H01L 21/8238; H01L 21/8258;
(Continued)

(56) References Cited

U.S. PATENT DOCUMENTS 9,812,524 B2 * 11/2017 Glass .................... H01L 21/845
2010/0187503 A1 * 7/2010 Moriyama ........ H01L 29/78687
257/24

(Continued)

OTHER PUBLICATIONS

International Search Report and Written Opinion for International Patent Application No. PCT/US2018/023753 dated Jan. 4, 2019, 13 pgs.

(Continued)

*Primary Examiner* — Michael M Trinh
(74) *Attorney, Agent, or Firm* — Schwabe, Williamson & Wyatt P.C.

(57) ABSTRACT

Semiconductor nanowire devices having (111)-plane channel sidewalls and methods of fabricating semiconductor nanowire devices having (111)-plane channel sidewalls are described. For example, an integrated circuit structure includes a first semiconductor device including a plurality of vertically stacked nanowires disposed above a substrate, each of the nanowires comprising a discrete channel region having <111> lateral sidewalls along a <110> carrier transport direction. The integrated circuit structure also includes a second semiconductor device including a semiconductor fin disposed above the substrate, the semiconductor fin having a channel region with a top and side surfaces, the channel region having <111> lateral sidewalls along a <110> carrier transport direction.

12 Claims, 17 Drawing Sheets

(51) Int. Cl.
*H01L 21/8238* (2006.01)
*H01L 21/8258* (2006.01)
*H01L 27/12* (2006.01)
*H01L 21/02* (2006.01)
*H01L 29/06* (2006.01)

(52) U.S. Cl.
CPC ...... *H01L 21/8258* (2013.01); *H01L 27/0924* (2013.01); *H01L 27/1211* (2013.01); *H01L 29/06* (2013.01); *H01L 29/78* (2013.01)

(58) Field of Classification Search
CPC ......... H01L 21/02; H01L 29/06; H01L 29/78; H01L 29/42392; H01L 29/78696; H01L 21/823842; H01L 21/823857; H01L 21/823821
See application file for complete search history.

(56) References Cited

U.S. PATENT DOCUMENTS

| | | | |
|---|---|---|---|
| 2014/0042386 A1* | 2/2014 | Cea | H01L 29/42392 257/9 |
| 2016/0133735 A1* | 5/2016 | Cappellani | H01L 29/78687 257/19 |
| 2016/0284643 A1 | 9/2016 | Wong et al. | |
| 2016/0293765 A1* | 10/2016 | Brask | H01L 21/30608 |
| 2017/0117360 A1 | 4/2017 | Ando et al. | |
| 2018/0166550 A1* | 6/2018 | Rodder | H01L 29/1054 |

OTHER PUBLICATIONS

International Preliminary Report of Patentability for International Patent Application No. PCT/US2018/023753 dated Oct. 1, 2020, 10 pgs.

* cited by examiner

US 11,398,478 B2

1

SEMICONDUCTOR NANOWIRE DEVICE HAVING (111)-PLANE CHANNEL SIDEWALLS

CROSS-REFERENCE TO RELATED APPLICATION

This patent application is a U.S. National Phase Application under 35 U.S.C. § 371 of International Application No. PCT/US2018/023753, filed Mar. 22, 2018, entitled "SEMICONDUCTOR NANOWIRE DEVICE HAVING (111)-PLANE CHANNEL SIDEWALLS," which designates the United States of America, the entire disclosure of which is hereby incorporated by reference in its entirety and for all purposes.

TECHNICAL FIELD

Embodiments of the disclosure are in the field of semiconductor devices and, in particular, semiconductor nanowire devices having (111)-plane channel sidewalls and methods of fabricating semiconductor nanowire devices having (111)-plane channel sidewalls.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, or gate-all-around devices, such as nanowires, have become more prevalent as device dimensions continue to scale down. Many different techniques have been attempted to reduce parasitic capacitance of such transistors. However, significant improvements are still needed in the area of parasitic capacitance suppression. Also, many different techniques have been attempted to manufacture devices with non-Si channel materials such as SiGe, Ge, and III-V materials. However, significant process improvements are still needed to integrate these materials onto Si wafers.

Furthermore, scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 5C' illustrates a cross-sectional spacer view of another embodiment of the nanowire-based semiconductor structure of FIG. 5A, as taken along the b-b' axis, in accordance with an embodiment of the present disclosure.

FIG. 7A illustrates a starting structure including a fin formed above a semiconductor substrate, the starting structure common to both NMOS and PMOS devices;

FIG. 7B illustrates the structure of FIG. 7A following sacrificial gate stack material deposition and gate patterning;

FIG. 7C illustrates the structure of FIG. 7B following fabrication of source and drain structures and formation of an interlayer dielectric layer between the three sacrificial gates;

FIG. 7D illustrates the structure of FIG. 7C following removal of the three sacrificial gates;

FIG. 7E illustrates, for an NMOS device, the structure of FIG. 7D following formation of a homogeneous semiconductor fin;

FIG. 7F illustrates, for a PMOS device, the structure of FIG. 7D following removal of the portions of the first and second sacrificial release layers exposed in the channel regions of the protruding portion of the fin;

FIG. 7G illustrates, for NMOS, the structure of FIG. 7E following formation of a permanent gate stack on the portions of the fin in the channel regions; and FIG. 7H illustrates, for PMOS, the structure of FIG. 7F following formation of a permanent gate stack on the portions of the active wire-forming layers and in the channel regions.

FIG. 8A illustrates a starting structure including a fin formed above a semiconductor substrate;

FIG. 8B illustrates the structure of FIG. 8A following sacrificial gate stack material deposition and gate patterning;

FIG. 8C illustrates the structure of FIG. 8B following removal of the portions of the first and second sacrificial release layers exposed in the source and drain regions of the protruding portion of the fin;

FIG. 8D illustrates the structure of FIG. 8C following deposition of a spacer-forming material layer.

FIG. 8E illustrates the structure of FIG. 8D following etching of the spacer-forming material layer to form cavity spacers;

FIG. 8F illustrates the structure of FIG. 8E following growth of source and drain structures between the cavity spacers;

FIG. 8G illustrates the structure of FIG. 8F following formation of a planarization oxide and removal of the three sacrificial gates;

FIG. 8H illustrates the structure of FIG. 8G following removal of the portions of the first and second sacrificial release layers exposed in the channel regions of the protruding portion of the fin;

FIG. 8I illustrates the structure of FIG. 8H following formation of a gate dielectric layer on the portions of the active wire-forming layers and in the channel regions; and FIG. 8J illustrates the structure of FIG. 8I following formation of permanent gate electrodes.

DESCRIPTION OF THE EMBODIMENTS

Figure 1:
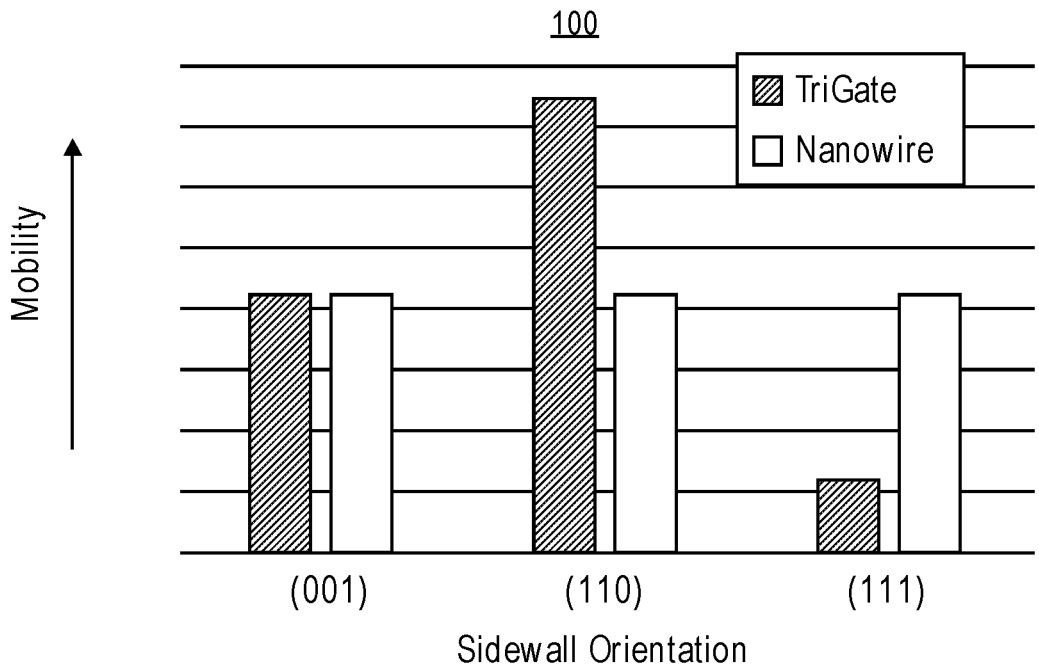
FIG. 1 is a plot of hole mobility as a function of sidewall orientation for trigate and nanowire structures, in accordance with an embodiment of the present disclosure.

Semiconductor nanowire devices having (111)-plane channel sidewalls and methods of fabricating semiconductor nanowire devices having (111)-plane channel sidewalls are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to ultra-scaled channel geometries with low variation enabled by (111) channel sidewalls with III-V NMOS and nanowire PMOS architectures. Embodiments may be implemented to fabricate highly scaled CMOS devices with high density, high drive current, and low capacitance.

To provide context, embodiments described herein may address issues associated with manufacturing thin, uniform fins and nanowires for MOSFET devices while maintaining device performance. For example, thinner fins typically reduce MOSFET leakage and threshold voltage, but the fabrication of a thinnest fin possible may be limited by fin width variation. Embodiments described herein may be implemented to reduce fin width variation while maintaining device performance.

In accordance with one or more embodiments described herein, (111) orientation is used as a fin sidewall and <110> transport for a CMOS integration scheme with PMOS group IV nanowire devices and NMOS III-V trigate or finFET or nanowire devices. It is to be appreciated that (111) fin sidewalls may produce atomically flat surfaces and thin, uniform fins, which are highly desirable for scaling CMOS to shorter gate lengths. However, hole transport for group IV finFETs with (111) sidewalls is poor due to heavy hole transport mass. On the other hand, III-V finFETs do not suffer from this heavy mass problem, nor do group IV PMOS nanowires. Additionally, by implementing (111) sidewalls, fin epitaxial growth problems caused by (111) faceted growth may be avoided.

To provide further context, FIG. 1 is a plot 100 of hole mobility as a function of sidewall orientation for trigate and nanowire structures, in accordance with an embodiment of the present disclosure. Thin, tall fins with (111) sidewalls may be associated with low hole mobility. Simulations predict approximately 65% hole mobility loss from (111) oriented sidewalls for trigate devices as seen in FIG. 1. It is noted that (111) sidewalls cause no mobility loss for nanowire (NW) devices. For all devices in FIG. 1 the direction of transport is <110>. Furthermore, the plot 100 of FIG. 1 may be most applicable to silicon based devices. In an embodiment, a III-V NMOS device, such as a fin, may be relatively insensitive to orientation because the electron band structure is isotropic near the band edge.

Figure 2:
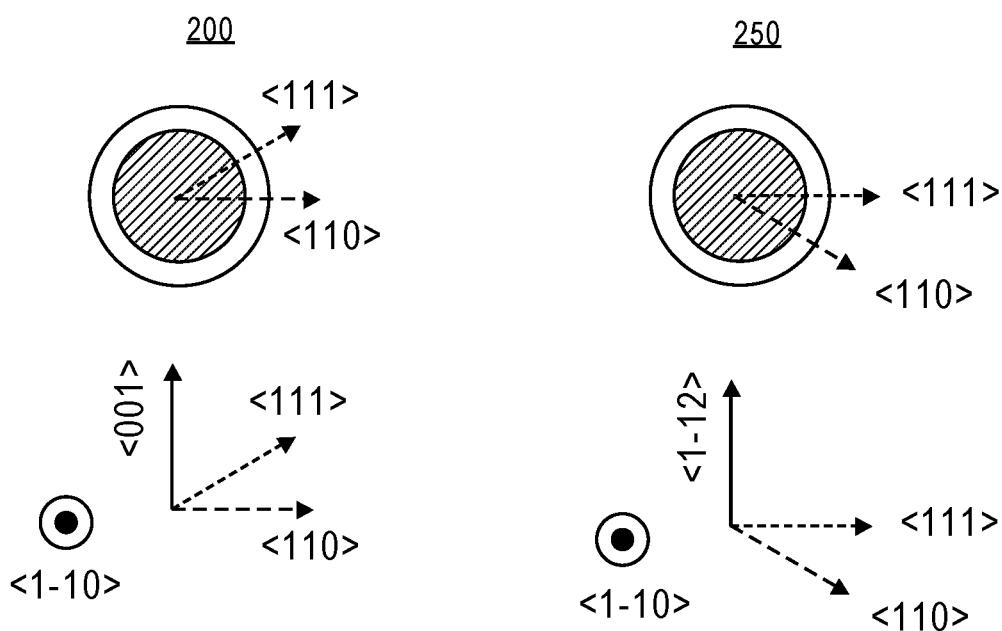
FIG. 2 illustrates cross-sectional views of a PMOS nanowire (NW) (110) sidewall structure as compared with a PMOS nanowire (NW) (111) sidewall structure, in accordance with an embodiment of the present disclosure.

FIG. 2 illustrates cross-sectional views of a PMOS nanowire (NW) (110) sidewall structure 200 as compared with a PMOS nanowire (NW) (111) sidewall structure 250, in accordance with an embodiment of the present disclosure. Referring to FIGS. 1 and 2, the nanowire (NW) device is insensitive to sidewall orientation since the circular NW surface is already tangent to all of the three orientations shown in FIG. 1, as illustrated in FIG. 2. It is to be appreciated that changing the sidewall orientation is equivalent to changing the axis labels due to the symmetry of the structure. It is also to be appreciated that many III-V NMOS devices are insensitive to orientation because the electron band structure is isotropic near the band edge.

Figure 3:
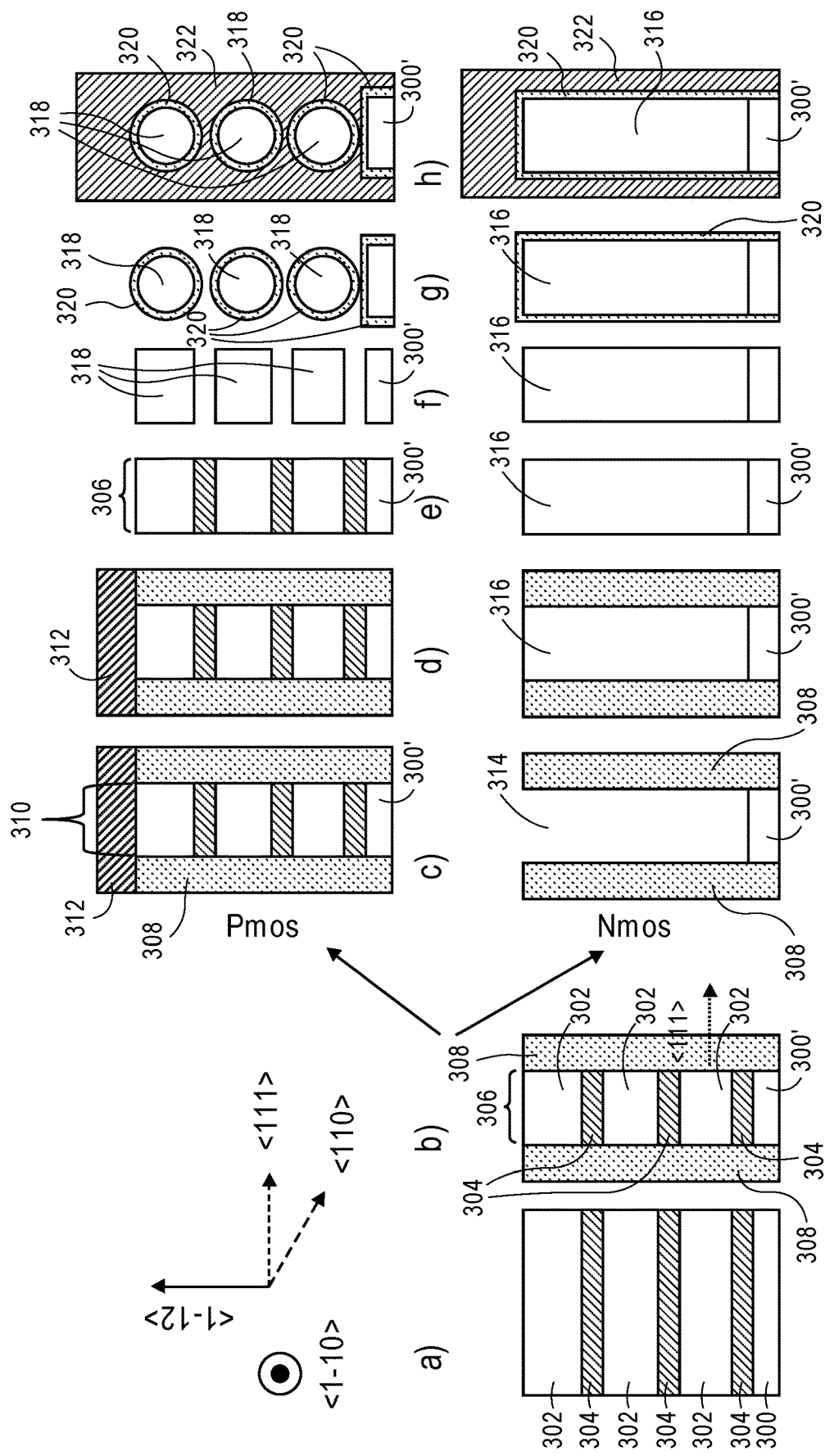
FIG. 3 is a schematic illustrating cross-sectional views of various operations in a process of fabricating CMOS transistors, in accordance with an embodiment of the present disclosure.

FIG. 3 is a schematic illustrating cross-sectional views of various operations in a process of fabricating CMOS transistors, in accordance with an embodiment of the present disclosure.

Referring to part (a) of FIG. 3, the process begins with an unpatterned Si wafer having alternating layers of PMOS NW channel material 302 (e.g., silicon) and nanowire separation material 304 (e.g., silicon germanium) formed thereon.

In part (b) of FIG. 3, fins 306 are then patterned and etched, with the patterning performed to ensure that the fin sidewalls are oriented in the <111> direction, as shown. In an embodiment, the fins 306 include a patterned portion 302' of the substrate 300, as is depicted. An insulating material 308 (e.g., silicon oxide) is then deposited on the fin 306 sidewalls.

In part (c) of FIG. 3, a PMOS fin 310 is masked with a masking layer 312. On the other hand, a substantial amount of an NMOS fin is etched to provide a trench 314 having insulating material 308 sidewalls. In an embodiment, the etching leaves a patterned portion 300' of substrate 300 to remain, as is depicted.

In part (d) of FIG. 3, an NMOS fin 316 is formed in trench 314. In an embodiment, NMOS fin 316 is or includes a III-V channel material.

In part (e) of FIG. 3, insulating material 308 sidewalls are removed from the NMOS fin 316. Also, masking layer 312 and any insulating material 308 sidewalls are removed from the PMOS fin 310.

In part (f) of FIG. 3, the nanowire separation material 304 is selectively removed from the PMOS fin 310, leaving PMOS nanowires 318 (e.g., silicon nanowires) above patterned portion 300' of substrate 300.

In part (g) of FIG. 3, a gate dielectric 320 is grown or deposited on the PMOS nanowires 318 and on the NMOS fin 316. It is to be appreciated that, in accordance with one embodiment, removal of the nanowire separation material 304 by a SiGe etching and oxidation process rounds the corners such that the nanowires 318 appear circular rather than square, as is depicted in part (g) of FIG. 3. In another embodiment, however, the corners of the nanowires remain substantially square, as is depicted in part (f) of FIG. 3.

In part (h) of FIG. 3, a gate material is formed on the structure of part (g) of FIG. 3. In an embodiment, the gate material is or includes a metal. Although not depicted in FIG. 3, the structure of part (h) of FIG. 3 can be subjected to additional process operations, such as source/drain formation. In an embodiment, then, a PMOS device includes a silicon channel region with one or more nanowires having <111> lateral sidewalls along a <110> carrier transport direction. An NMOS device includes a III-V material channel region with a fin having <111> lateral sidewalls along a <110> carrier transport direction.

With reference again to FIG. 3, it is to be appreciated that the views shown are cross-sectional views shown in the channel regions of the corresponding NMOS and PMOS fabrication flows. It is also to be appreciated that exemplary materials are described for illustrative purposes, but are not so limited. For example, other suitable combinations of alternating semiconductor layers may be used to form fins that may undergo the processing scheme of FIG. 3, such as materials selected from various combinations of silicon, germanium, silicon germanium, or a Group III-V material. It is also to be appreciated that the NMOS and PMOS process flows may be swapped for the complementary device type in some embodiments.

In accordance with one or more embodiments of the present disclosure, fabricating devices having (111) sidewalls improves a III-V fin epitaxial growth process. For state-of-art wafer orientations, a peak forms in the middle of a growth trench in which a III-V material (such as InGaAs) is grown. The peak represents a location where two different (111) planes meet. For InGaAs fins, gallium may segregate to the peak, resulting in undesired variations in InGaAs composition across the grown fin.

Figure 4:
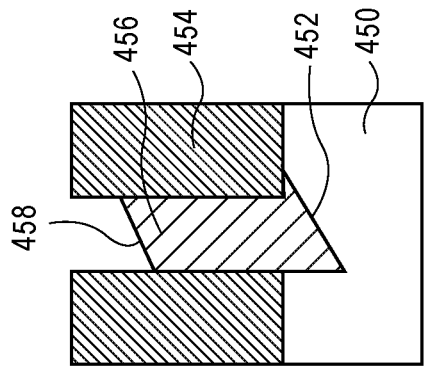
FIG. 4 illustrates comparative epitaxial growth processes for different growth planes, in accordance with an embodiment of the present disclosure.
Figure 4:
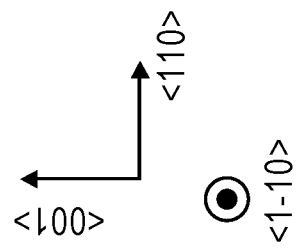
Figure 4:
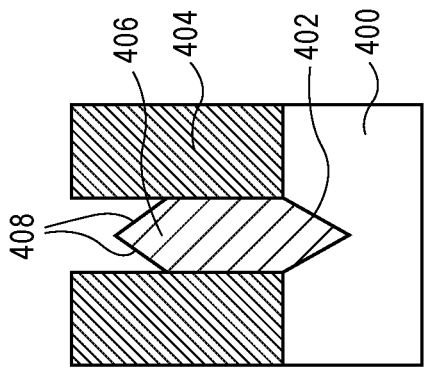
Figure 4:
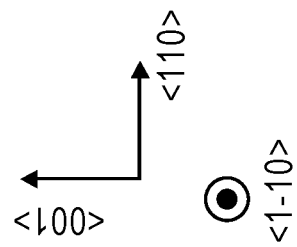

As an exemplary comparison, FIG. 4 illustrates comparative epitaxial growth processes for different growth planes, in accordance with an embodiment of the present disclosure. In the structure on the left-hand side of FIG. 4, a silicon substrate 400 has a trench 402 therein, and a trench structure 404 formed thereon. A III-V material 406 (such as InGaAs) having (110) sidewalls is grown in the trench 402 and in the trench structure 404 is depicted with facets 408. In the structure on the right-hand side of FIG. 4, which may effectively represent wafer rotation relative to the structure on the left-hand side of FIG. 4, a silicon substrate 450 has a trench 452 therein, and a trench structure 454 formed thereon. A III-V material 456 (such as InGaAs) having (111) sidewalls is grown in the trench 452 and in the trench structure 454 is depicted with a single facet 458. Thus, in the structure on the right-hand side of FIG. 4, formation of a peak is prevented which may result in more uniform composition of an InGaAs fin. In an embodiment, a more uniform fin composition results in higher Ion/Ioff current ratios.

One or more embodiments described herein are directed to nanowire-based MOS (metal oxide semiconductor) field effect transistors (FETs) and trigate or fin-based MOS FETs. Particular embodiments are directed to differentiated CMOS architectures including both nanowire-based MOS FETs and trigate or fin-based MOS FETs.

To provide context, embodiments herein may address issues associated with mobility and drive current degradation for both NMOS and PMOS devices as devices scale in multi-gate silicon technology. One previous solution includes fabrication of a single device architecture (e.g., tri-gate) on a single wafer orientation. Such an approach provides optimal drive current for one device (e.g., PMOS tri-gate), but degraded drive current for the complementary device (e.g., NMOS tri-gate). Another previous solution includes fabrication of a hybrid orientation technology, where one wafer is provided with two different crystal orientations. However, such an approach may be associated with defect issues and likely requires buffer zones which consume additional die area. A third previous solution has involved the use of stress to overcome drive current degradation from orientation. However, such an approach is proving difficult to implement at scaled device geometries, as there may not be sufficient space for source/drain stressors.

In accordance with one or more embodiments described herein, and addressing one or more of the issues outlined above, a PMOS device in a CMOS architecture has a nanowire (NW) device architecture, while an NMOS device in the CMOS architecture has a tri-gate (TG) device architecture. In one such embodiment, NMOS TG devices or finFET devices are fabricated together with PMOS NW or nanoribbon (NR) devices. In certain embodiments, improved drive current is achieved relative to a single wafer orientation and single device type option. Additionally, smaller die area may be used relative to the hybrid orientation option. Furthermore, large sources of stress may not be required (although it is to be appreciated that they still may be included).

Thus, as is described in greater detail below in association with FIGS. 1, 5A, 5B, 5C, 5C', 6A, 6B and 7A-7H, embodiments described herein include the combination of a PMOS device based on a NW device architecture and an NMOS device based on a TG (or fin) architecture on a commonly oriented substrate. It is to be appreciated that for state of the art implementations, both NMOS and PMOS devices are normally either NW architecture or TG architecture, and not a combination of the two.

Figure 5A:
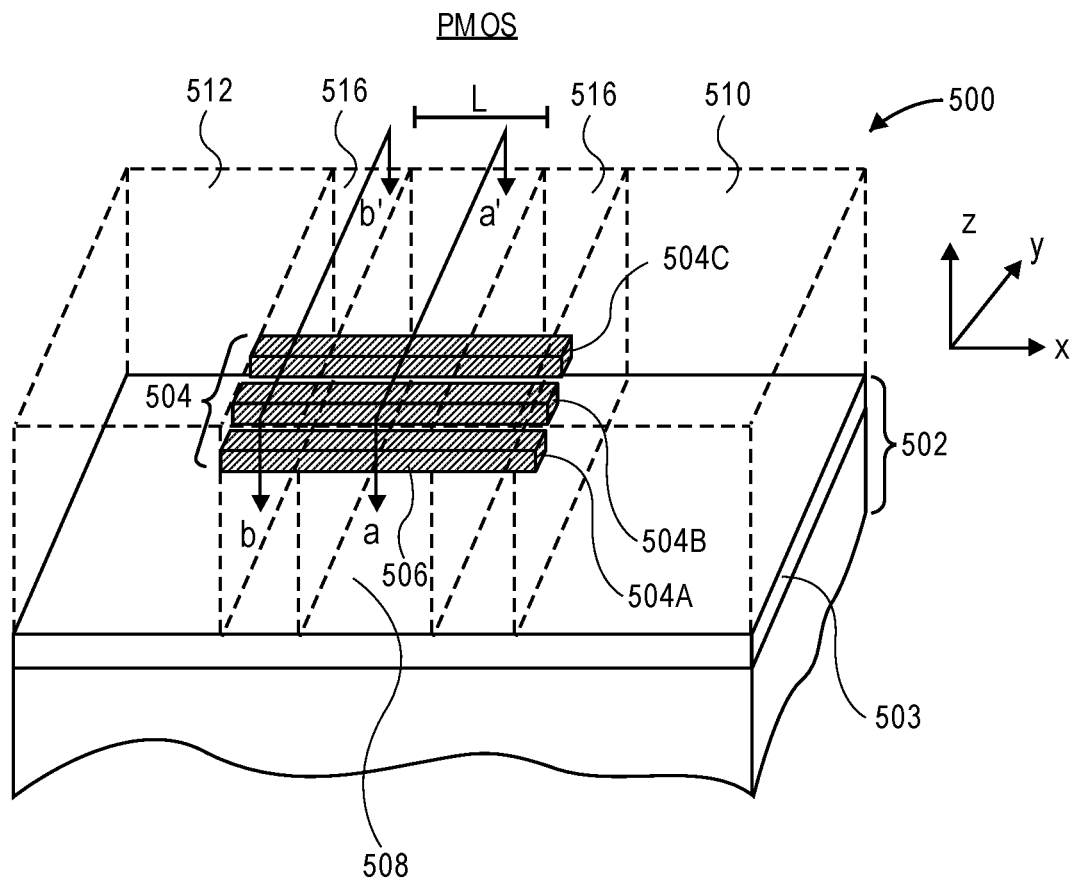
FIG. 5A illustrates a three-dimensional cross-sectional view of a PMOS nanowire-based semiconductor structure, in accordance with an embodiment of the present disclosure.
Figure 5B:
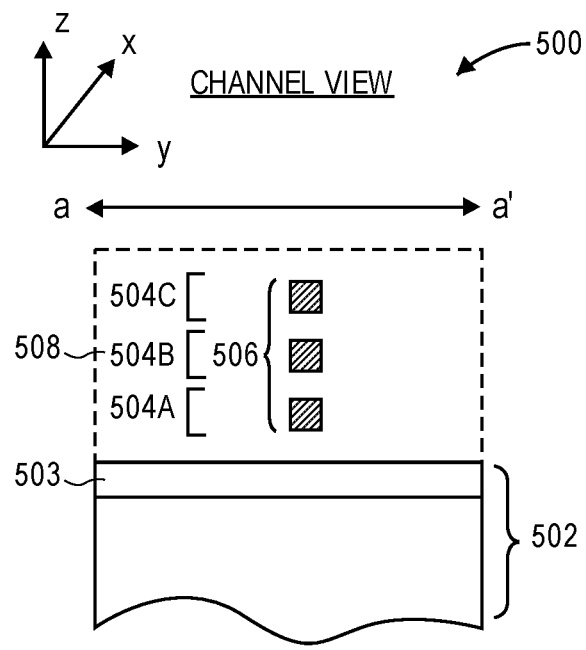
FIG. 5B illustrates a cross-sectional channel view of the nanowire-based semiconductor structure of FIG. 5A, as taken along the a-a' axis, in accordance with an embodiment of the present disclosure.
Figure 5C:
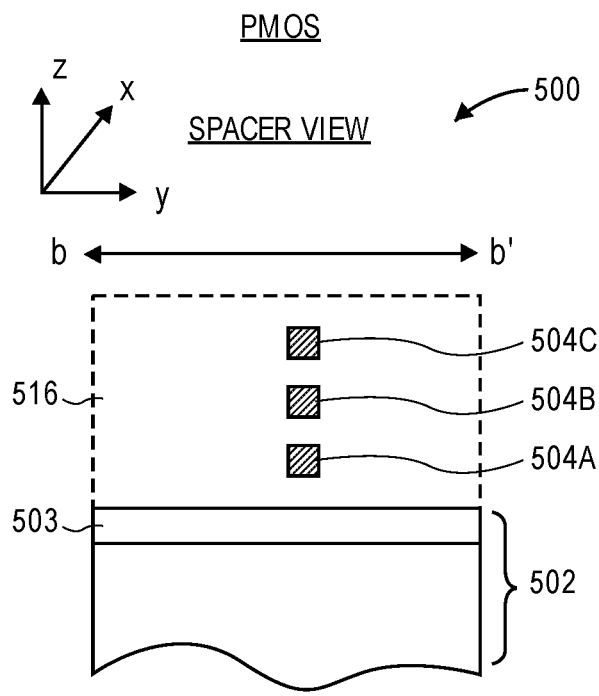
FIG. 5C illustrates a cross-sectional spacer view of the nanowire-based semiconductor structure of FIG. 5A, as taken along the b-b' axis, in accordance with an embodiment of the present disclosure.
Figure 5C:
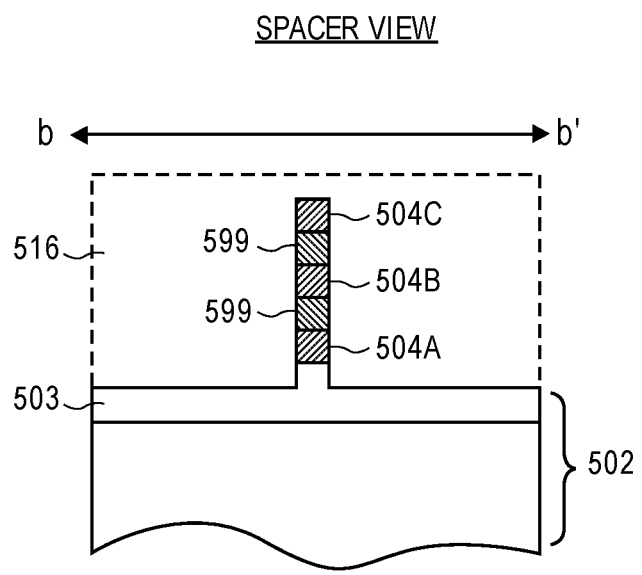

As an example of some of the structural ramifications of implementing fabrication approaches described herein, FIG. 5A illustrates a three-dimensional cross-sectional view of a PMOS nanowire-based semiconductor structure, in accordance with an embodiment of the present disclosure. FIG. 5B illustrates a cross-sectional channel view of the nanowire-based semiconductor structure of FIG. 5A, as taken along the a-a' axis, in accordance with an embodiment of the present disclosure. FIG. 5C illustrates a cross-sectional spacer view of the nanowire-based semiconductor structure of FIG. 5A, as taken along the b-b' axis, in accordance with an embodiment of the present disclosure. FIG. 5C' illustrates a cross-sectional spacer view of another embodiment of the nanowire-based semiconductor structure of FIG. 5A, as taken along the b-b' axis, in accordance with an embodiment of the present disclosure.

Referring to FIG. 5A, a PMOS semiconductor device 500 includes one or more vertically stacked nanowires (504 set) disposed above a substrate 502. Embodiments herein are targeted at both single wire devices and multiple wire devices. As an example, a three nanowire-based PMOS device having nanowires 504A, 504B and 504C is shown for illustrative purposes. For convenience of description, nanowire 504A is used as an example where description is focused on only one of the nanowires. It is to be appreciated that where attributes of one nanowire are described, embodiments based on a plurality of nanowires may have the same attributes for each of the nanowires. In an embodiment, each of the nanowires 504A, 504B and 504C has <111> lateral sidewalls along a <110> carrier transport direction (source to drain direction).

Referring to both FIGS. 5A and 5B, each of the nanowires 504 (e.g., as 504A, 504B and 504C) includes a channel region 506 disposed in the nanowire. The channel region 506 has a length (L). A gate electrode stack 508 surrounds the entire perimeter of each of the channel regions 506. The gate electrode stack 508 includes a gate electrode along with a gate dielectric layer disposed between the channel region 506 and the gate electrode (distinct gate electrode and gate dielectric layer not shown here, but are described in greater detail below). The channel region 506 is discrete in that it is completely surrounded by the gate electrode stack 508 without any intervening material such as underlying substrate material or overlying channel fabrication materials. Accordingly, in embodiments having a plurality of nanowires 504 e.g., such as nanowires 504A, 504B and 504C), the channel regions 506 of the nanowires are also discrete relative to one another. However, it is to be appreciated, in some embodiments, the lowermost wire or wires may not be fully discrete and may have a tri-gate like architecture at the bottom portion of the wire stack. In an embodiment, each of the nanowires 504A, 504B and 504C has <111> lateral sidewalls along a <110> carrier transport direction.

Referring again to FIG. 5A, each of the nanowires 504 is coupled to common source and drain regions 510 and 512 disposed on either side of the channel regions 506. In an embodiment, the common source and drain regions 510 and 512 are semiconductor regions. Although not depicted, a pair of conductive contacts may be formed on the common source/drain regions 510/512. It is to be appreciated that in alternative embodiments, source and drain regions are discrete regions of nanowires. In such embodiments, source and drain contacts may be formed to surround the source and drain regions, respectively, of each of the nanowires.

Referring collectively to FIGS. 5A and 5C, in an embodiment, the semiconductor device 500 further includes a pair of spacers 516. The spacers 516 are disposed between the gate electrode stack 508 and the common source and drain regions 510 and 512. In an embodiment, each of the pair of spacers 516 is a continuous spacer, as opposed to having distinct outer and inner spacers. In one such embodiment, each spacer of the pair of spacers 516 includes a continuous material disposed along a sidewall of the gate electrode stack 508 and surrounding a discrete portion of each of the vertically stacked nanowires 504.

Referring collectively to FIGS. 5A and 5C', in another embodiment, the spacers 516 do not surround discrete portions of the nanowires 504. Instead, an intervening sacrificial material portion 599 (e.g., silicon germanium portions between silicon nanowires) remains after nanowire processing (e.g., in the case that removal of sacrificial material portion 599 is hindered either by etch limitations or by the nature of the processing integrations scheme used).

Figure 6A:
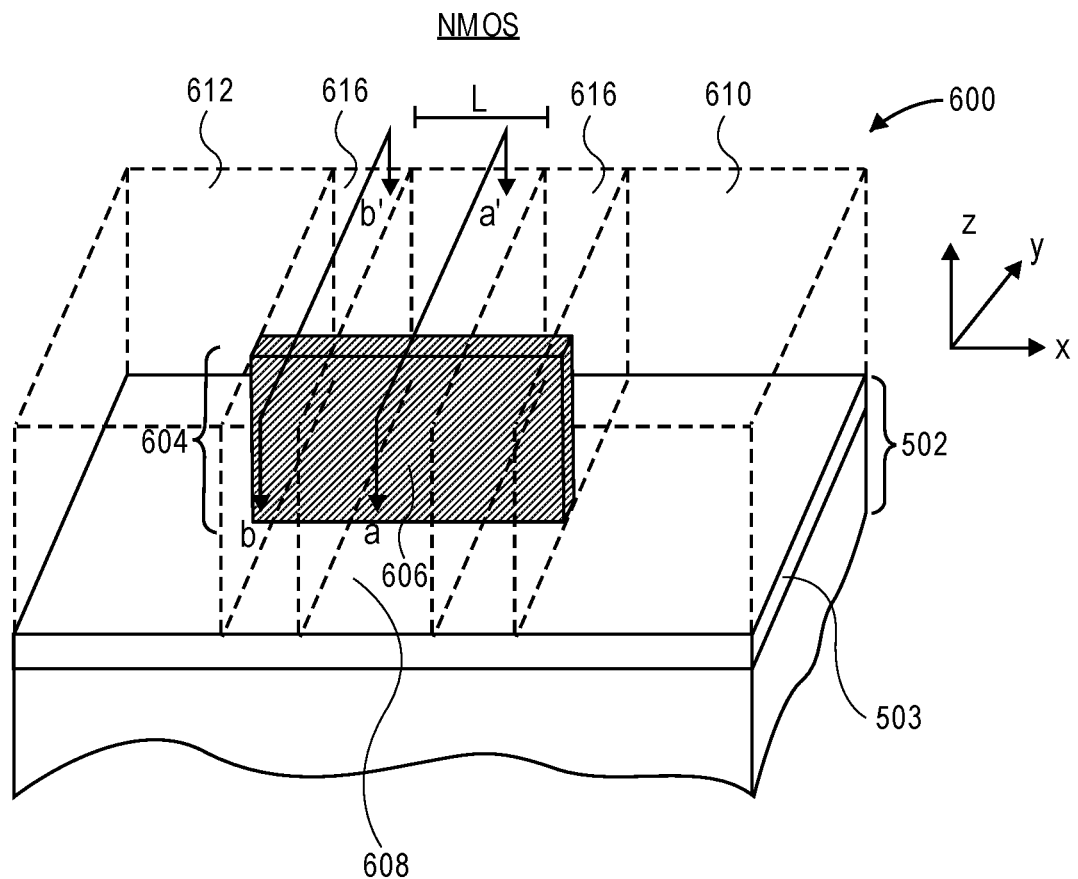
FIG. 6A illustrates a three-dimensional cross-sectional view of an NMOS fin-based semiconductor structure, in accordance with an embodiment of the present disclosure.
Figure 6B:
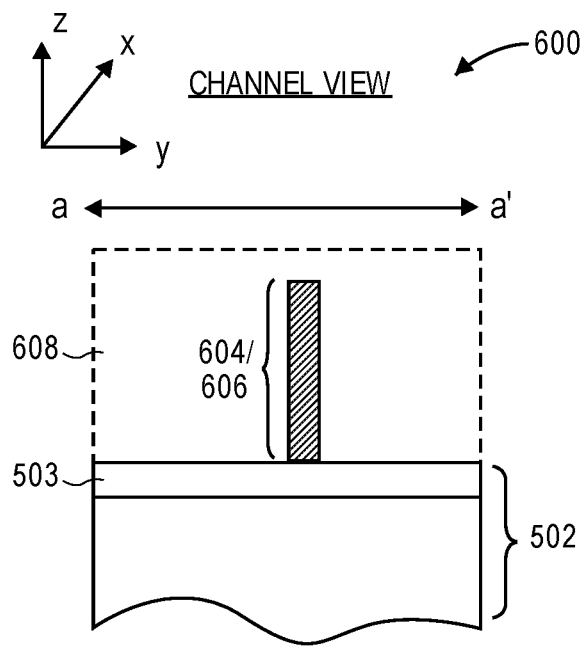
FIG. 6B illustrates a cross-sectional channel view of the fin-based semiconductor structure of FIG. 6A, as taken along the a-a' axis, in accordance with an embodiment of the present disclosure.

As complementary example to FIG. 5A of some of the structural ramifications of implementing fabrication approaches described herein, FIG. 6A illustrates a three-dimensional cross-sectional view of an NMOS fin-based semiconductor structure, in accordance with an embodiment of the present disclosure. FIG. 6B illustrates a cross-sectional channel view of the fin-based semiconductor structure of FIG. 6A, as taken along the a-a' axis, in accordance with an embodiment of the present disclosure.

Referring to FIGS. 6A and 6B, an NMOS semiconductor device 600 includes a fin 604 disposed above a substrate 502. The fin 604 includes a channel region 606. The channel region 606 has a length (L). A gate electrode stack 608 surrounds the entire perimeter (e.g., top and side surfaces) of the channel region 606. The gate electrode stack 608 includes a gate electrode along with a gate dielectric layer disposed between the channel region 606 and the gate electrode (distinct gate electrode and gate dielectric layer not shown here, but are described in greater detail below). In an embodiment, the channel region 606 is a fin composed of III-V material having <111> lateral sidewalls along a <110> carrier transport direction (source to drain direction).

Referring again to FIG. 6A, the fin 604 is coupled to source and drain regions 610 and 612 disposed on either side of the channel region 606. In an embodiment, the source and drain regions 610 and 612 are semiconductor regions. Although not depicted, a pair of conductive contacts may be formed on the source/drain regions 610/612. Referring again to FIG. 6A, in an embodiment, the semiconductor device 600 further includes a pair of spacers 616. The spacers 616 are disposed between the gate electrode stack 608 and the source and drain regions 610 and 612.

Refer to both FIGS. 5A and 6A, substrate 502 may be composed of a material suitable for semiconductor device fabrication. In one embodiment, substrate 502 includes a lower bulk substrate composed of a single crystal of a material which may include, but is not limited to, silicon. In an embodiment, an upper insulator layer 503 composed of a material which may include, but is not limited to, silicon dioxide, silicon nitride or silicon oxy-nitride is disposed on the lower bulk substrate. Thus, the structures 500 and 600 may be fabricated from a starting semiconductor-on-insulator substrate. Alternatively, the structures 500 and 600 are formed directly from a bulk substrate and local oxidation is used to form electrically insulative portions in place of the above described upper insulator layer. In another alternative embodiment, the structures 500 and 600 are formed directly from a bulk substrate and doping may be used to form electrically isolated active regions, such as nanowires and fins, respectively, thereon.

As will be appreciated for a typical integrated circuit, both N- and P-channel transistors may be fabricated on a single common substrate 502 to form a CMOS integrated circuit. In accordance with embodiments described herein, the PMOS devices are such as those described in association with structure 500 (i.e., nanowire-based devices) and the NMOS devices are such as those described in association with structure 600 (i.e., fin-based devices). In alternative embodiments, however, the NMOS devices are such as those described in association with structure 500 (i.e., nanowire-based devices) and the PMOS devices are such as those described in association with structure 600 (i.e., fin-based devices).

Referring to FIG. 5A, in an embodiment, the nanowires 504 may be sized as wires or ribbons and may have squared-off or rounder corners. In an embodiment, the nanowires 504 are single-crystalline. In an embodiment, the dimensions of the nanowires 504, from an end-on cross-sectional perspective, are on the nano-scale. For example, in a specific embodiment, the smallest dimension of each of the nanowires 504 is less than approximately 50 nanometers. In an embodiment, the nanowires 504 are composed of a strained material, particularly in the channel regions 506. In an embodiment, the nanowires 504A-504C are uniaxially strained nanowires. In the case of PMOS, the uniaxially strained nanowire or plurality of nanowires may be uniaxially strained with compressive strain. The width and height of each of the nanowires 504A-504C is shown as approximately the same, however, they need not be. For example, in another embodiment (not shown), the width of the nanowires 504A-504C is substantially greater than the height. In a specific embodiment, the width is approximately 2-10 times greater than the height. Nanowires with such geometry may be referred to as nanoribbons. In an alternative embodiment (also not shown), the nanoribbons are oriented vertically. That is, each of the nanowires 504A-504C has a width and a height, the width substantially less than the height.

Referring to FIG. 6A, in an embodiment, the fin 604 may have squared-off or rounder corners. In an embodiment, the fin 604 is single-crystalline. It is to be appreciated that other orientations may also be considered. In an embodiment, the dimensions of the fin 604, from an end-on cross-sectional perspective, are on the nano-scale. For example, in a specific embodiment, the smallest dimension of each of the fin 604 is less than approximately 20 nanometers. In an embodiment, the fin 604 is composed of a strained material, particularly in the channel regions 606. In an embodiment, the fin 604 is a uniaxially strained fin. In the case of NMOS, the uniaxially strained fin may be uniaxially strained with tensile strain.

Referring again to FIGS. 5A and 6A, in an embodiment, the gate electrode of gate electrode stack 508 or 608 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire or fin. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In an embodiment, the gate electrode of gate stack 508 is a P-type gate electrode while the gate electrode of gate stack 608 is an N-type gate electrode.

In an embodiment, the source and drain regions 510/512 or 610/612 are embedded source and drain regions, e.g., at least a portion of the nanowires or fin, respectively, is removed and replaced with a source/drain material region, as is depicted in FIGS. 5A and 6A. In an embodiment, the source and drain regions 510/512 or 610/612 are semiconductor regions. In one such embodiment, the semiconductor regions are epitaxially grown from the ends of the nanowires 504 (or fin 604) and/or from an exposed portion of an underlying bulk semiconductor substrate. In an embodiment, the source and drain regions 510/512 or 610/612 are composed of a material such as, but not limited to, silicon, germanium, silicon germanium, or a Group III-V material. In one embodiment, the source and drain regions 510/512 or 610/612 are doped with impurity atoms. In an embodiment, the source and drain regions 510/512 or 610/612 are composed of a material different from the channel material (e.g., different from the material of nanowires 504 or fin 604).

Referring again to FIGS. 5A and 6A, in an embodiment, the spacers 516 or 616 are composed of an insulative dielectric material such as, but not limited to, silicon dioxide, silicon oxy-nitride or silicon nitride. Overlying source/drain contacts (not shown) are, in an embodiment, fabricated from a metal species. The metal species may be a pure metal, such as nickel or cobalt, or may be an alloy such as a metal-metal alloy or a metal-semiconductor alloy (e.g., such as a silicide material).

Referring again to FIGS. 5A and 6A, it is to be appreciated that additional electrical contact and interconnect wiring may be fabricated in order to integrate devices such as 500 and 600 into an integrated circuit.

In another aspect, a sacrificial or replacement gate process may be used to access channel regions to form nanowire devices and complementary fin devices. As an example, FIGS. 7A-7H illustrate three-dimensional cross-sectional views representing various operations in a method of fabricating complementary semiconductor nanowire and fin structures, in accordance with an embodiment of the present disclosure.

Figure 7B:
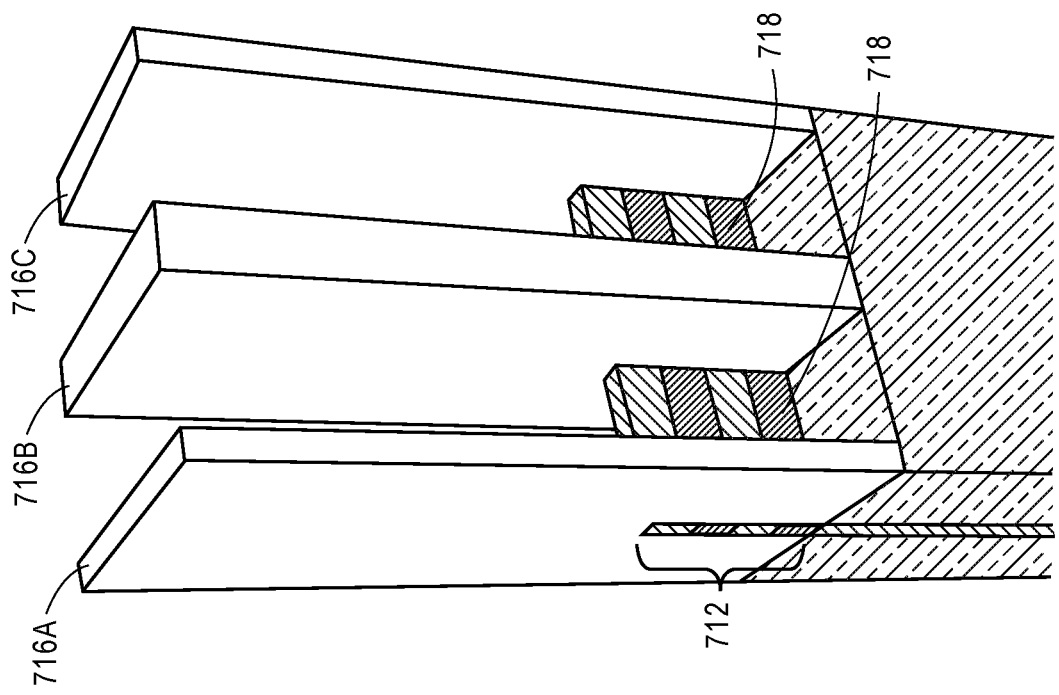
FIGS. 7A-7H illustrate three-dimensional cross-sectional views representing various operations in a method of fabricating complementary semiconductor nanowire and fin structures, in accordance with an embodiment of the present disclosure, where.
Figure 7A:
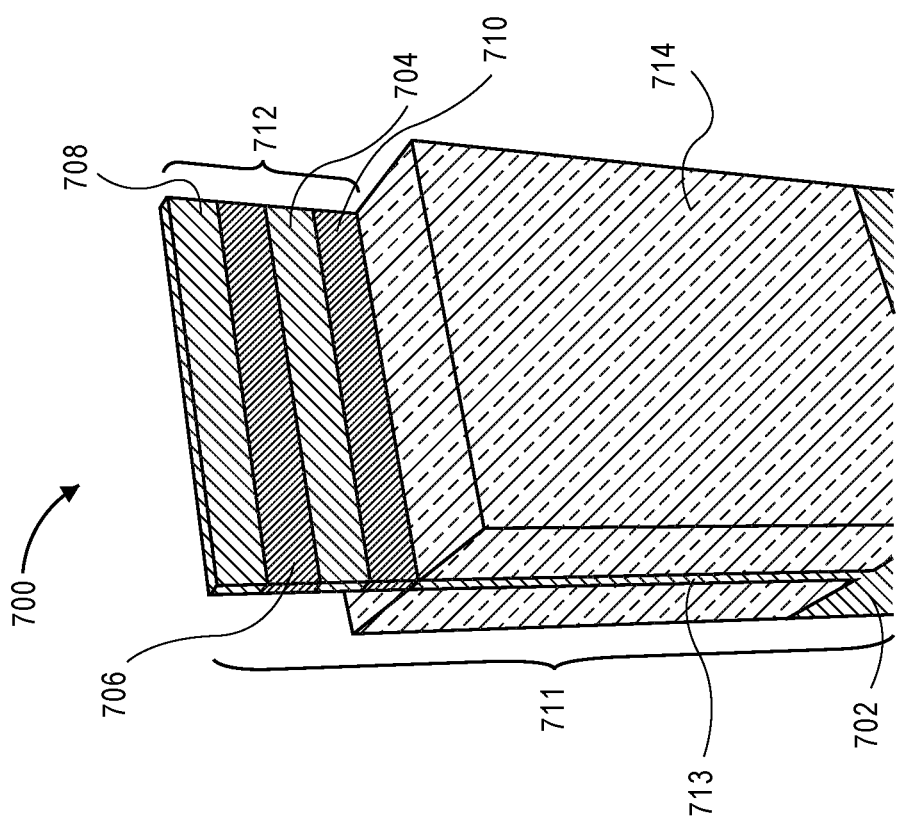

Referring to FIG. 7A, a starting structure 700 common to both NMOS and PMOS devices includes a fin 711 formed above a semiconductor substrate 702. The fin 711 includes a buried portion 713 and a protruding portion 712. The protruding portion 712 includes active wire-forming layers 704 and 708, such as silicon wire-forming layers. A first sacrificial release layer 706 (such as a first silicon germanium sacrificial release layer) is disposed between the active wire-forming layers 704 and 708. A second sacrificial release layer 710 (such as a second silicon germanium sacrificial release layer) is disposed between the active wire-forming layer 704 and the buried portion 713 of the fin 711. In an embodiment, an isolation material region 714 (such as a silicon oxide region) is formed on either side of the buried portion 713 of the fin 711, but the protruding portion 712 remains electrically coupled to the substrate 702, as is depicted in FIG. 7A. In other embodiments, however, it is to be appreciated that, in the case of fabrication of bulk devices, a subsequently formed permanent gate stack may be isolated from the semiconductor substrate 702 by a shallow trench isolation (STI) region formed after fin patterning. Alternatively, a subsequently formed permanent gate stack may be isolated from the semiconductor substrate 702 by a bottom gate isolation (BGI) structure, which may be fabricated at the time of permanent gate stack fabrication.

Referring again to FIG. 7A, in an embodiment, then, nanowires for an PMOS device can ultimately be formed by first stacking active and sacrificial materials and then etching the desired fin stack, followed by isolation material deposition, planarization and etch, and ultimate removal of the sacrificial material at least in the channel region. In the specific example described, the formation of two silicon nanowires is considered. The complementary NMOS device can ultimately be formed by removing the active and sacrificial materials and then growing a homogeneous fin, such as a III-V material fin, as described below.

FIG. 7B illustrates the structure of FIG. 7A following sacrificial gate stack material deposition and gate patterning. In a specific example showing the formation of three gate structures, FIG. 7B illustrates the protruding portion 712 of the fin 711 with three sacrificial gates 716A, 716B, and 716C disposed thereon. In one such embodiment, the three sacrificial gates 716A, 716B, and 716C are composed of a sacrificial gate oxide layer and a sacrificial polysilicon gate layer which are, e.g., blanket deposited and patterned with a plasma etch process. It is to be appreciated that the patterning of the three sacrificial gates 716A, 716B, and 716C exposes source and drain regions 718 of the protruding portion 712 of the fin 711. It is also to be appreciated that, although not depicted, insulating spacers may be formed along the sidewalls of each of the three sacrificial gates 716A, 716B, and 716C.

Figure 7D:
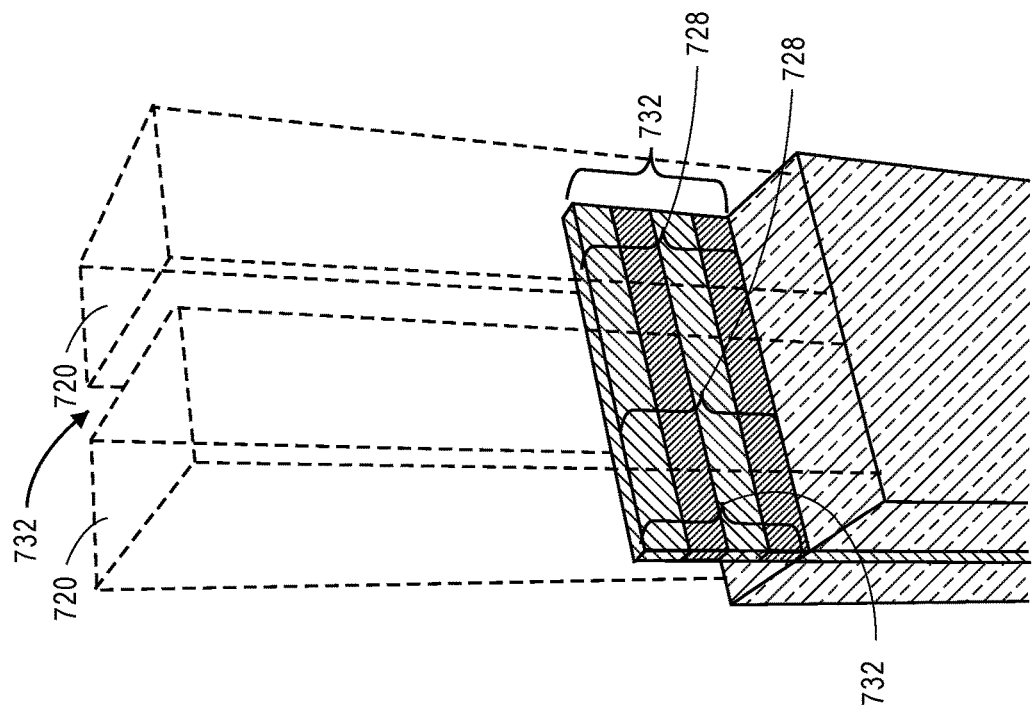
Figure 7C:
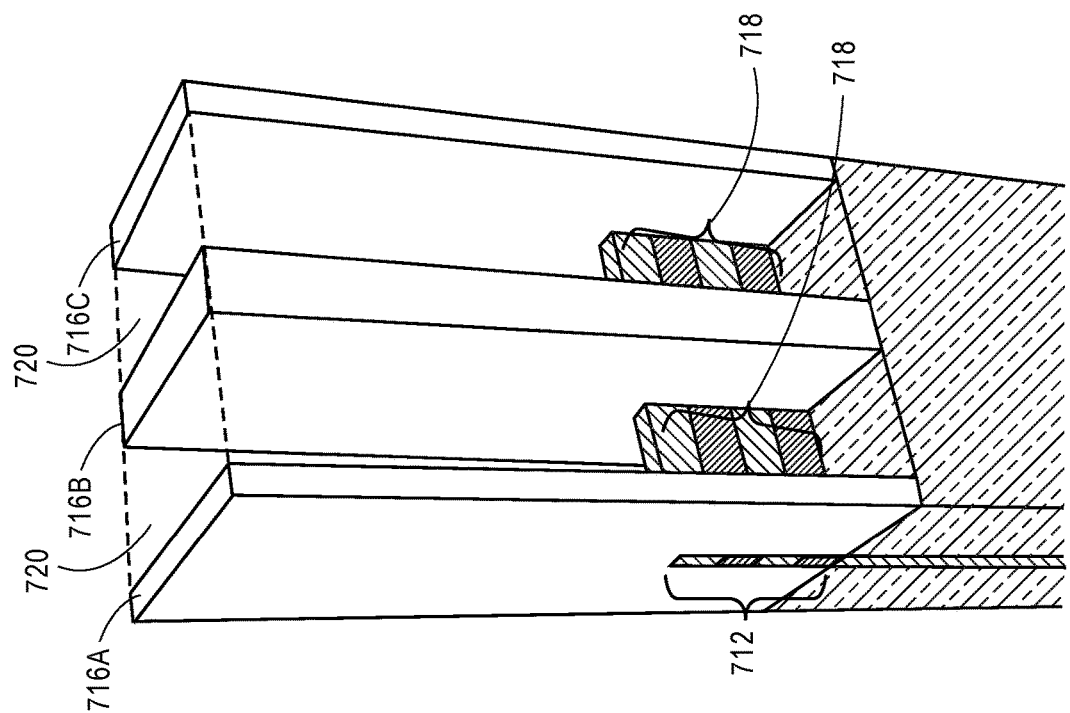

FIG. 7C illustrates the structure of FIG. 7B following fabrication of source and drain structures 728 and formation of an interlayer dielectric layer regions 720 between the three sacrificial gates 716A, 716B, and 716C. The fabrication of source and drain structures 728 can simply involve doping the regions 718 exposed by the three sacrificial gates 716A, 716B, and 716C (as depicted in FIG. 7B), can involve removal of the regions 718 and regrowth of a semiconductor material, or can involve growth of additional semiconductor material on the regions 718. In an embodiment, doping of the source and drain structures 728 may be performed either in situ or post epitaxial growth.

FIG. 7D illustrates the structure of FIG. 7C following removal of the three sacrificial gates 716A, 716B, and 716C. For example, in an embodiment, an oxide is deposited and planarized (e.g., to form interlayer dielectric layer regions 720) prior to removal of the three sacrificial gates 716A, 716B, and 716C. Such interlayer dielectric layer regions 720 cover the source and drain structures 728. Removal of the sacrificial gates 716A, 716B, and 716C is then performed without damage to adjacent structures, exposing channel regions 732.

Figure 7F:
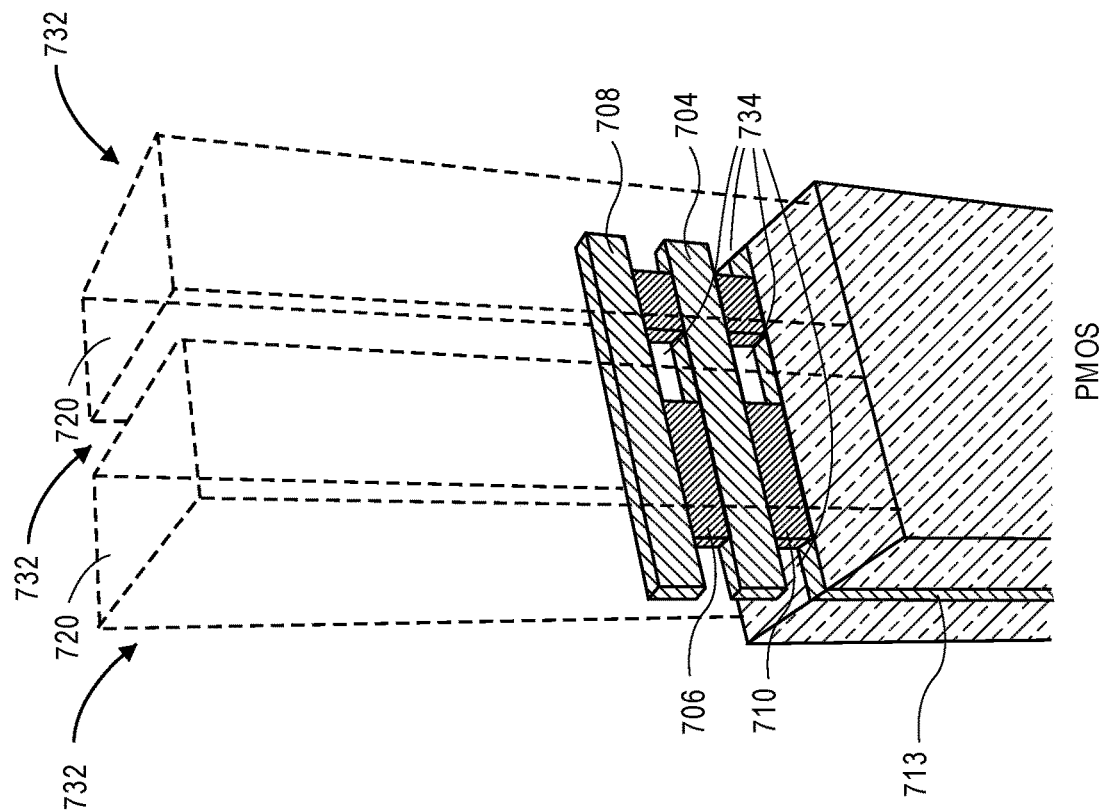
Figure 7E:
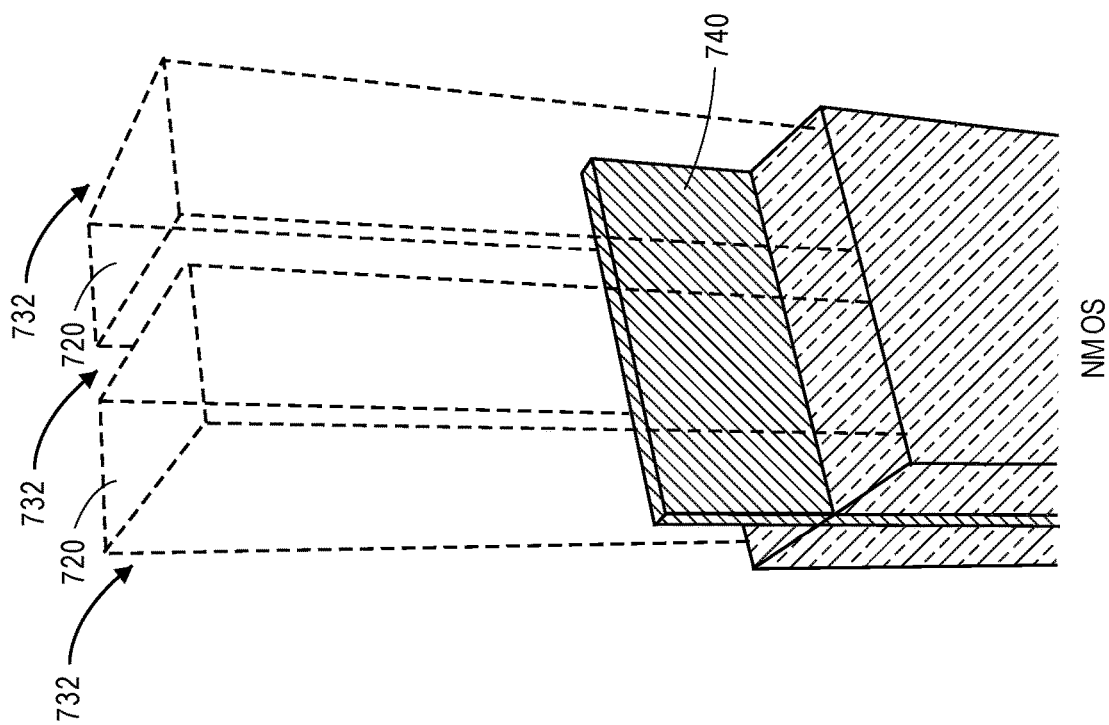

FIG. 7E illustrates, for an NMOS device, the structure of FIG. 7D following formation of a homogeneous semiconductor fin 740. Thus, exposed fin 740 portions are provided in the channel regions 732 of the NMOS device. The formation of fin 740 can be performed by removing the sacrificial and nanowire forming layers in the NMOS region and regrowing with a III-V material, such as InGaAs, as was described in association with FIG. 3. In an embodiment, fin 740 is or includes a III-V material having <111> lateral sidewalls along a <110> carrier transport direction.

FIG. 7F illustrates, for a PMOS device, the structure of FIG. 7D following removal of the portions of the first 706 and second 710 sacrificial release layers exposed in the channel regions 732 of the protruding portion 712 of the fin 711. The removal forms spacings 734 between the active wire-forming layers 704 and 708 and between the active wire-forming layer 704 and the buried portion 713 of the fin 711. In an embodiment, the active wire-forming layers have <111> lateral sidewalls along a <110> carrier transport direction.

In an embodiment, etch chemistries such as carboxylic acid/nitric acid/HF chemistry, and citric acid/nitric acid/HF, for example, may be utilized to selectively etch the portions of first and second silicon germanium sacrificial release layers (selective to silicon active wires) exposed in the channel regions 732 of the protruding portion 712 of the fin 711. Alternatively, an isotropic dry etch may be used. The resulting discrete portions of the active wire-forming layers 704 and 708 formed in the channel regions 732 will, in one embodiment, ultimately become channel regions in a nanowire-based device. Thus, at the process stage depicted in FIG. 7F, channel engineering or tuning may be performed. For example, in one embodiment, the discrete portions of the active wire-forming layers 704 and 708 shown in FIG. 7F are subsequently thinned using oxidation and etch processes.

Figure 7H:
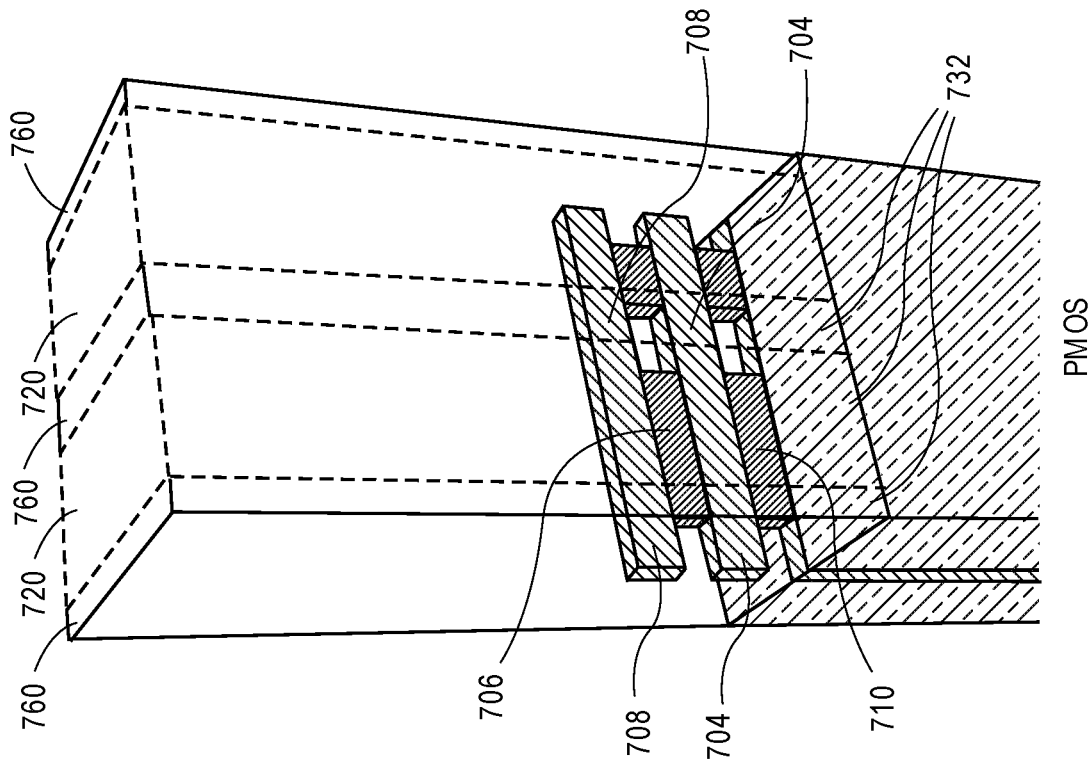
Figure 7G:
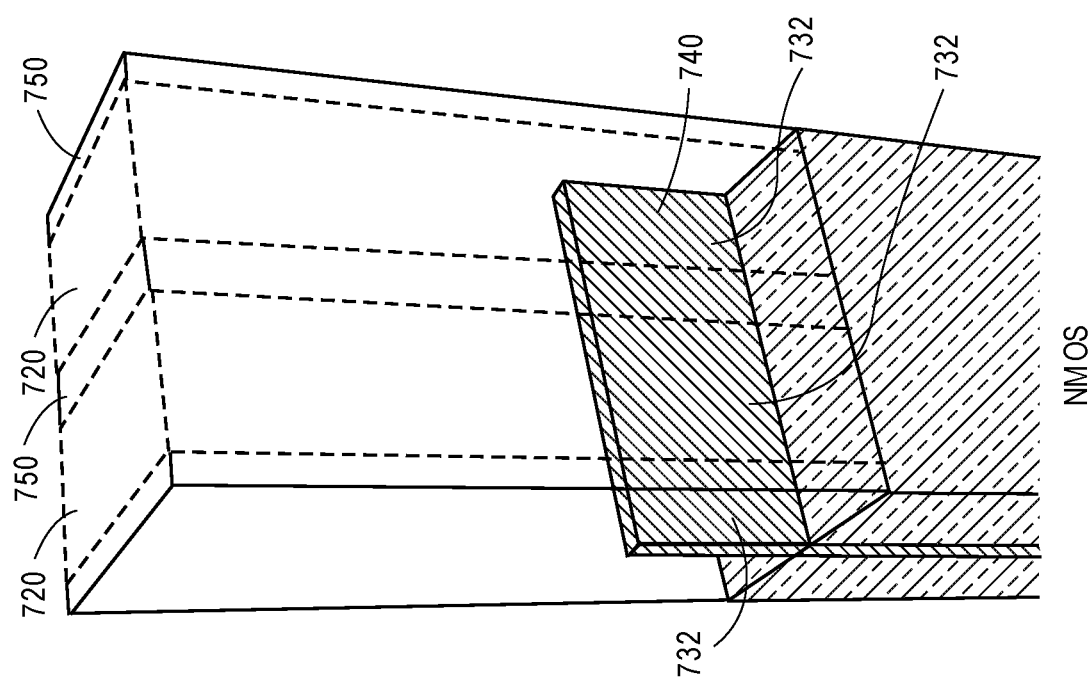

FIG. 7G illustrates, for NMOS, the structure of FIG. 7E following formation of a permanent gate stack 750 on the portions of the fin 740 in the channel regions 732. FIG. 7H illustrates, for PMOS, the structure of FIG. 7F following formation of a permanent gate stack 760 on the portions of the active wire-forming layers 704 and 708 in the channel regions 732.

Referring to both FIGS. 7G and 7H, in an embodiment, the gate stack 750 or 760 includes a high-k gate dielectric layer, e.g., formed by atomic layer deposition (ALD). In an embodiment the gate stack 750 or 760 further includes a metal gate electrode, e.g., formed by depositing a metal (or metal-containing material) or stack of metals (or stack metal-containing materials) in the channel regions 732. It is to be appreciated that further fabrication for both the NMOS device and the PMOS device may involve formation of conductive contacts to source and drain structures 728 and/or to gate electrode stacks 750 or 760.

In another aspect, one or more embodiments described herein are directed to the fabrication of cavity spacers for nanowire devices.

To provide context, reducing parasitic capacitance in nanowires and also reducing dopant contamination in active wires can greatly improve the performance of such devices. In accordance with an embodiment of the present disclosure, parasitic capacitance is reduced by forming a cavity spacer by removing a sacrificial layer subsequent to gate patterning. The process can involve isotropically depositing a spacer material followed by a spacer etch process performed in source and drain regions of the device. In addition to reducing parasitic capacitance, embodiments described herein may also be useful for limiting entry of source and drain dopant material into active channel regions that may otherwise occur through a sacrificial semiconductor layer.

A sacrificial or replacement gate process may be used to first access source and drain regions and then access channel regions to form nanowire devices with low parasitic capacitance. As an example, FIGS. 8A-8J illustrate three-dimensional cross-sectional views representing various operations in a method of fabricating a semiconductor nanowire structure having a cavity spacer, in accordance with an embodiment of the present disclosure.

Figure 8B:
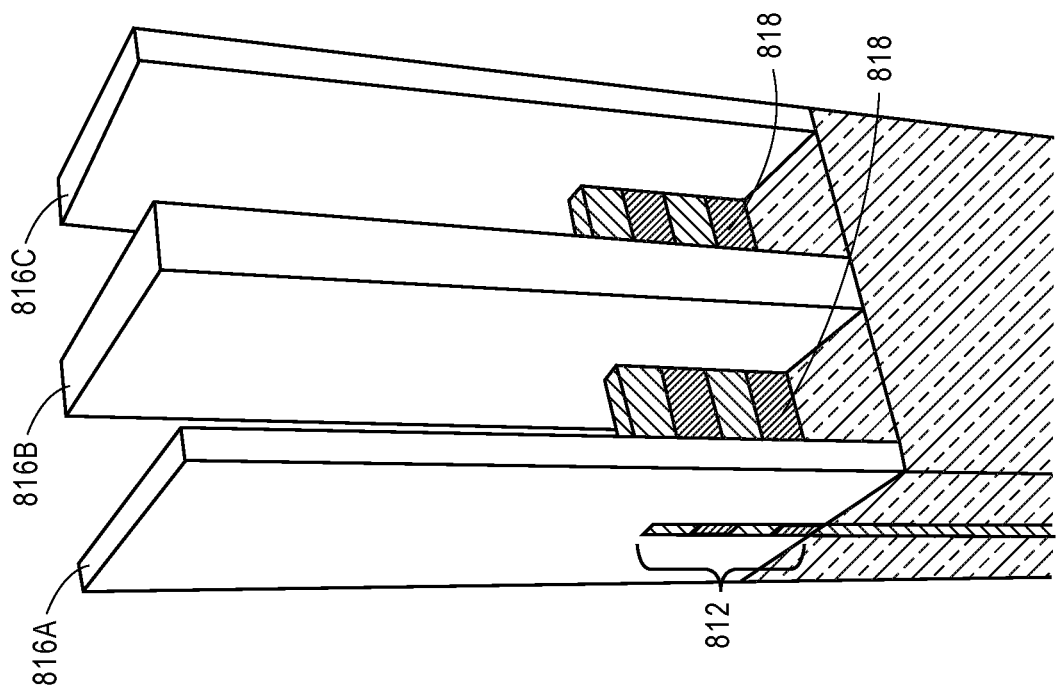
FIGS. 8A-8J illustrate three-dimensional cross-sectional views representing various operations in a method of fabricating a semiconductor nanowire structure having a cavity spacer, in accordance with an embodiment of the present disclosure, where.
Figure 8A:
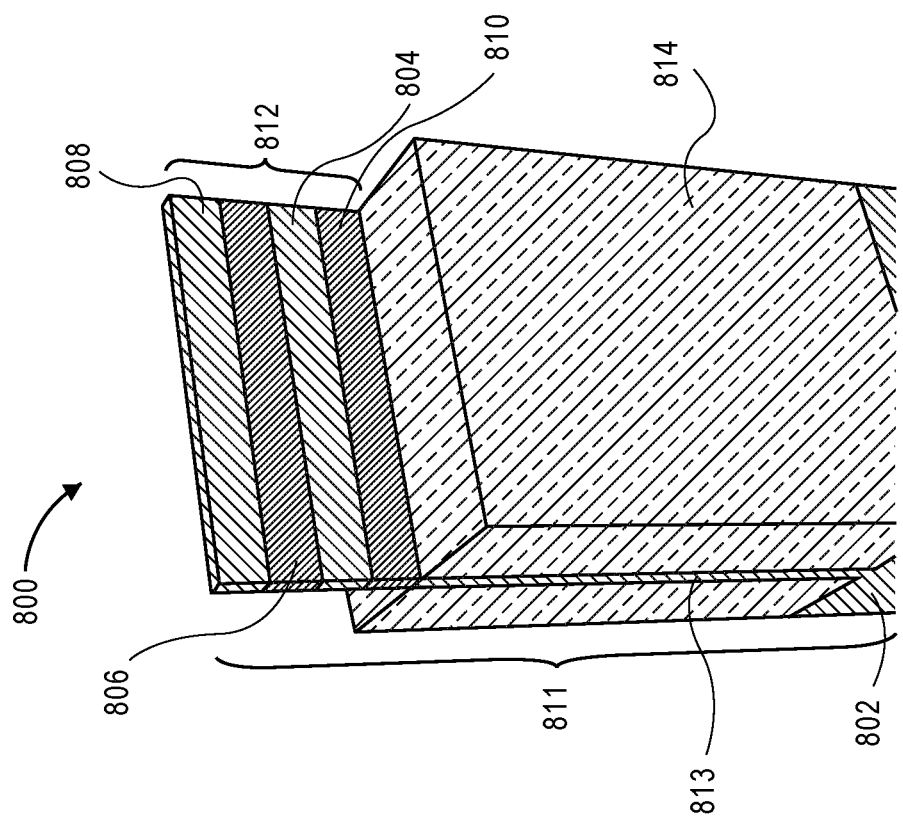

Referring to FIG. 8A, a starting structure 800 includes a fin 811 formed above a semiconductor substrate 802. The fin 811 includes a buried portion 813 and a protruding portion 812. The protruding portion 812 includes active wire-forming layers 804 and 808, such as silicon wire-forming layers. A first sacrificial release layer 806 (such as a first silicon germanium sacrificial release layer) is disposed between the active wire-forming layers 804 and 808. A second sacrificial release layer 810 (such as a second silicon germanium sacrificial release layer) is disposed between the active wire-forming layer 804 and the buried portion 813 of the fin 811. In an embodiment, an isolation material region 814 (such as a silicon oxide region) is formed on either side of the buried portion 813 of the fin 811, but the protruding portion 812 remains electrically coupled to the substrate 802, as is depicted in FIG. 8A. In other embodiments, however, it is to be appreciated that, in the case of fabrication of bulk devices, a subsequently formed permanent gate stack may be isolated from the semiconductor substrate 802 by a shallow trench isolation (STI) region formed after fin patterning. Alternatively, a subsequently formed permanent gate stack may be isolated from the semiconductor substrate 802 by a bottom gate isolation (BGI) structure, which may be fabricated at the time of permanent gate stack fabrication.

Referring again to FIG. 8A, in an embodiment, then, nanowires can ultimately be formed by first stacking active and sacrificial materials and then etching the desired fin stack, followed by isolation material deposition, planarization and etch. In the specific example described, the formation of two silicon nanowires is considered, e.g., for a PMOS device having a channel region with <111> lateral sidewalls along a <110> carrier transport direction.

FIG. 8B illustrates the structure of FIG. 8A following sacrificial gate stack material deposition and gate patterning. In a specific example showing the formation of three gate structures, FIG. 8B illustrates the protruding portion 812 of the fin 811 with three sacrificial gates 816A, 816B, and 816C disposed thereon. In one such embodiment, the three sacrificial gates 816A, 816B, and 816C are composed of a sacrificial gate oxide layer and a sacrificial polysilicon gate layer which are, e.g., blanket deposited and patterned with a plasma etch process. It is to be appreciated that the patterning of the three sacrificial gates 816A, 816B, and 816C exposes source and drain regions 818 of the protruding portion 812 of the fin 811.

Figure 8D:
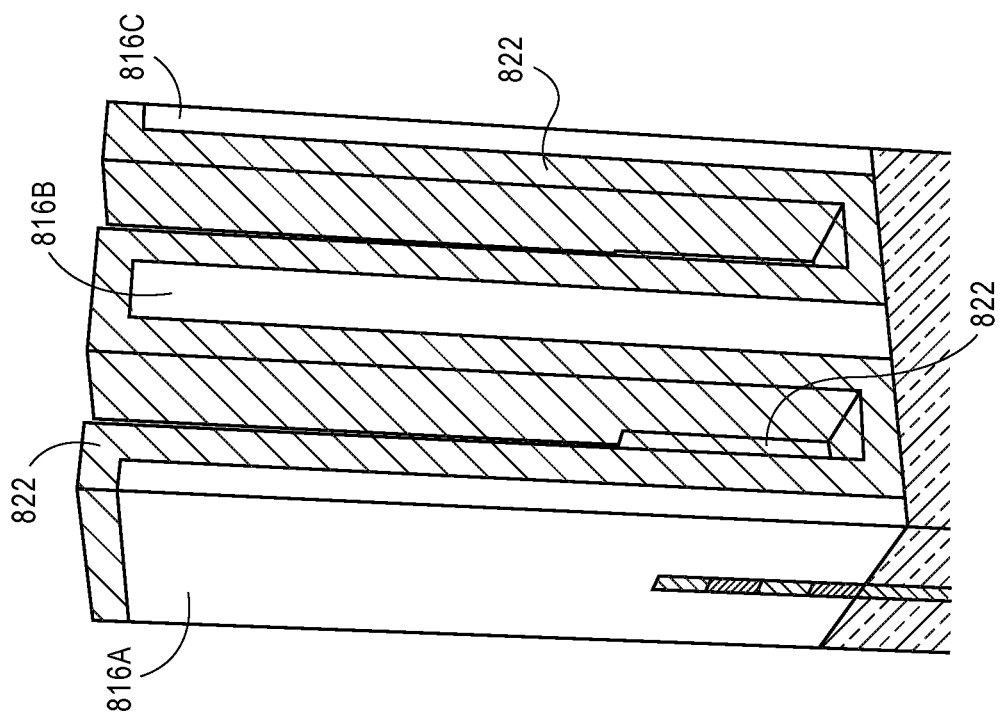
Figure 8C:
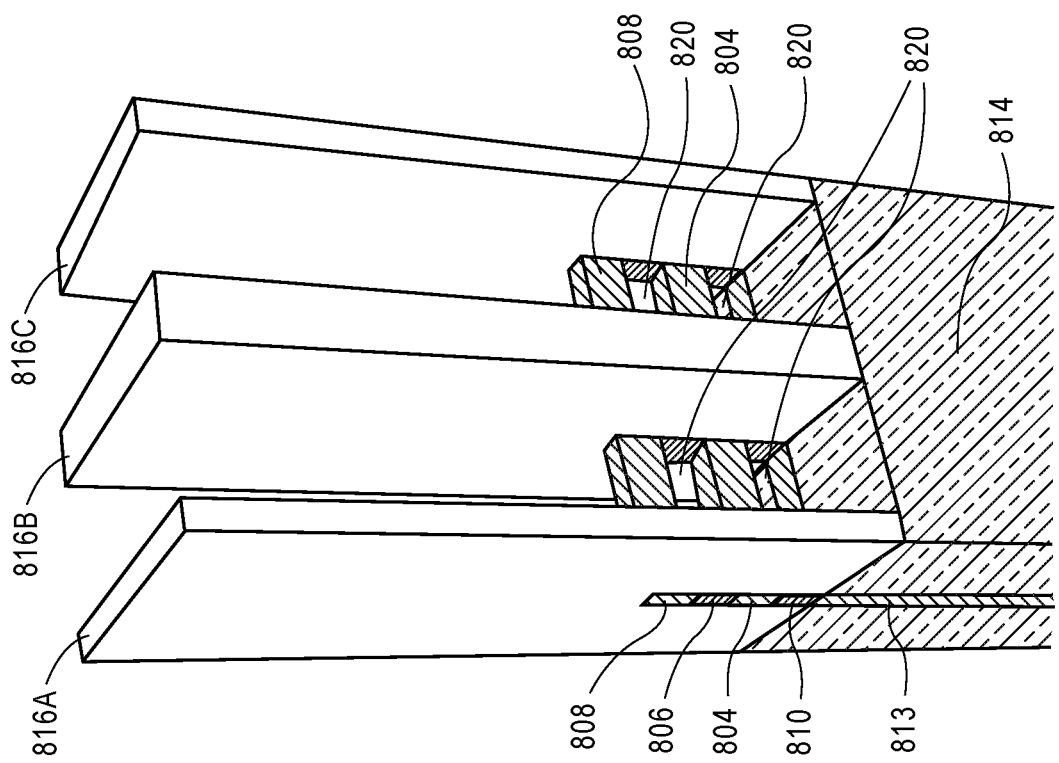

FIG. 8C illustrates the structure of FIG. 8B following removal of the portions of the first 806 and second 810 sacrificial release layers exposed in the source and drain regions 818 of the protruding portion 812 of the fin 811. The removal forms spacings 820 between the active wire-forming layers 804 and 808 and between the active wire-forming layer 804 and the buried portion 813 of the fin 811. However, in an embodiment, the portions of the first 806 and second 810 sacrificial release layers underneath the three sacrificial gates 816A, 816B, and 816C is retained, as is depicted in FIG. 8C.

FIG. 8D illustrates the structure of FIG. 8C following deposition of a spacer-forming material layer 822. In an embodiment, the spacer-forming material layer 822 is an insulative dielectric material such as, but not limited to, silicon dioxide, silicon oxy-nitride or silicon nitride. In an embodiment, the spacer-forming material layer 822 is formed by atomic layer deposition (ALD).

Figure 8F:
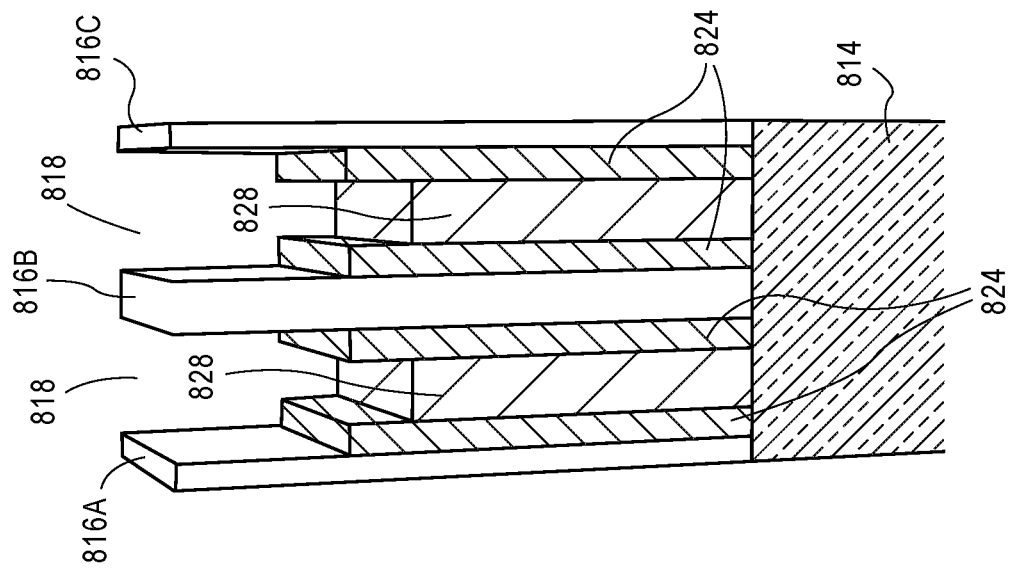
Figure 8E:
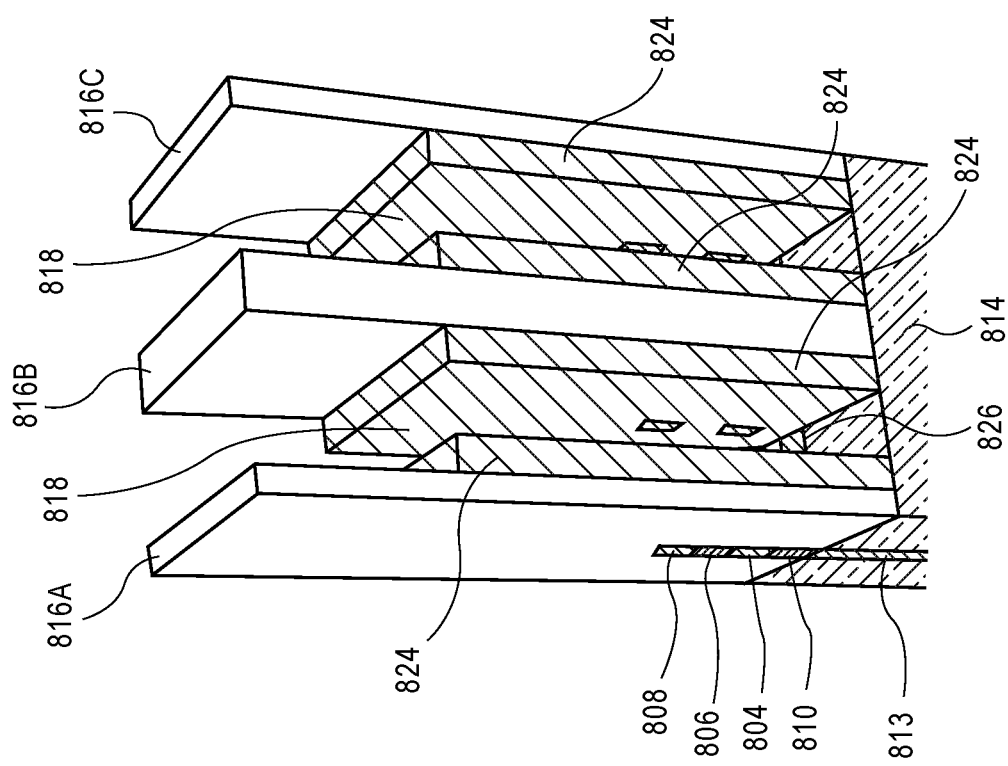

FIG. 8E illustrates the structure of FIG. 8D following etching of the spacer-forming material layer 822 to form cavity spacers 824. The cavity spacers are formed along the sidewalls of the three sacrificial gates 816A, 816B, and 816C. In an embodiment, an anisotropic plasma etching process is used to form the cavity spacers 824. In an embodiment, the etching process also removes the portions of the active wire-forming layers 804 and 808 exposed in the source and drain regions 8218, as is depicted in FIG. 8E. However, the portions of the active wire-forming layers 804 and 808 beneath the cavity spacers 824 are retained. In a further embodiment, the etching process recesses a portion of the buried portion 813 of the fin 811 to form a recessed portion 826, as is also depicted in FIG. 8E. In an embodiment, the cavity spacers 824 are formed to a height below the height of the three sacrificial gates 816A, 816B, and 816C, as is depicted in FIG. 8E.

FIG. 8F illustrates the structure of FIG. 8E following growth of source and drain structures 828 between the cavity spacers 824. In an embodiment, the growth of source and drain structures 828 is performed by epitaxial deposition of a semiconductor material in the source and drain regions 818. In one embodiment, the epitaxial growth is initiated on exposed ends of the portions of the active wire-forming layers 804 and 808 beneath the cavity spacers 824. In another embodiment, the epitaxial growth is initiated on the exposed surface of the recessed portion 826 of the buried portion 813 of the fin 811. In yet another embodiment, the epitaxial growth is initiated on exposed ends of the portions of the active wire-forming layers 804 and 808 beneath the cavity spacers 824 and on the exposed surface of the recessed portion 826 of the buried portion 813 of the fin 811. In an embodiment, the source and drain structures 828 are formed to a height below the height of the cavity spacers 824, as is depicted in FIG. 8F. In an embodiment, doping of the source and drain structures 828 may be performed either in situ or post epitaxial growth.

Figure 8H:
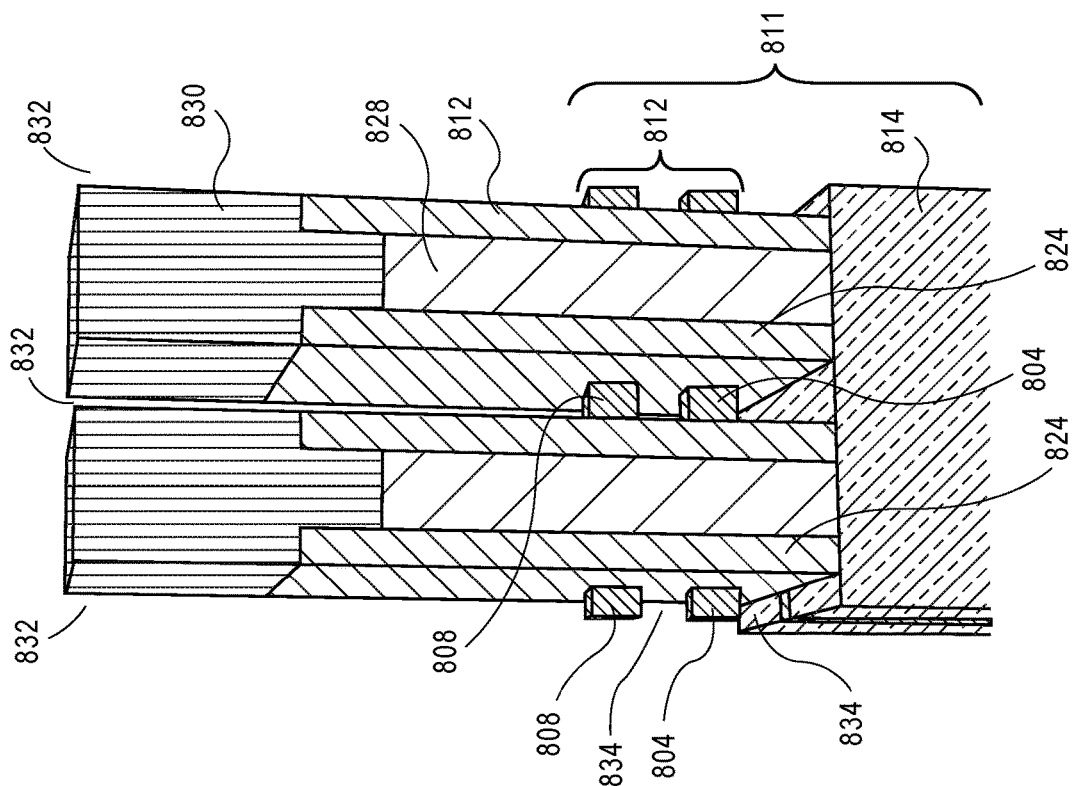
Figure 8G:
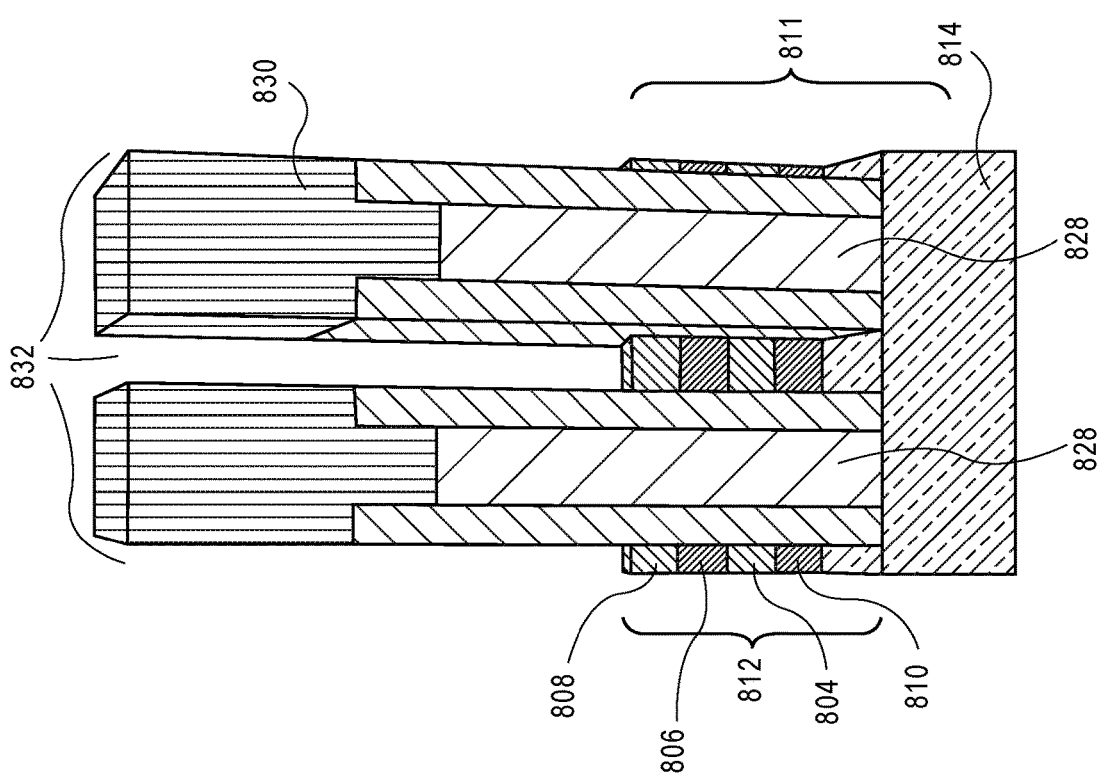

FIG. 8G illustrates the structure of FIG. 8F following formation of a planarization oxide 830 and removal of the three sacrificial gates 816A, 816B, and 816C. For example, in an embodiment, an oxide is deposited and planarized prior to removal of the three sacrificial gates 816A, 816B, and 816C. Such a planarization oxide 830 covers the source and drain structures 828. Removal of the sacrificial gates 816A, 816B, and 816C is then performed without damage to adjacent structures, exposing channel regions 832.

FIG. 8H illustrates the structure of FIG. 8G following removal of the portions of the first 806 and second 810 sacrificial release layers exposed in the channel regions 832 of the protruding portion 812 of the fin 811. The removal forms spacings 834 between the active wire-forming layers 804 and 808 and between the active wire-forming layer 804 and the buried portion 813 of the fin 811.

The discrete portions of the active wire-forming layers 804 and 808 formed in the channel regions 832 will, in one embodiment, ultimately become channel regions in a nanowire-based device. Thus, at the process stage depicted in FIG. 8H, channel engineering or tuning may be performed. For example, in one embodiment, the discrete portions of the active wire-forming layers 804 and 808 shown in FIG. 8H are subsequently thinned using oxidation and etch processes.

Figure 8J:
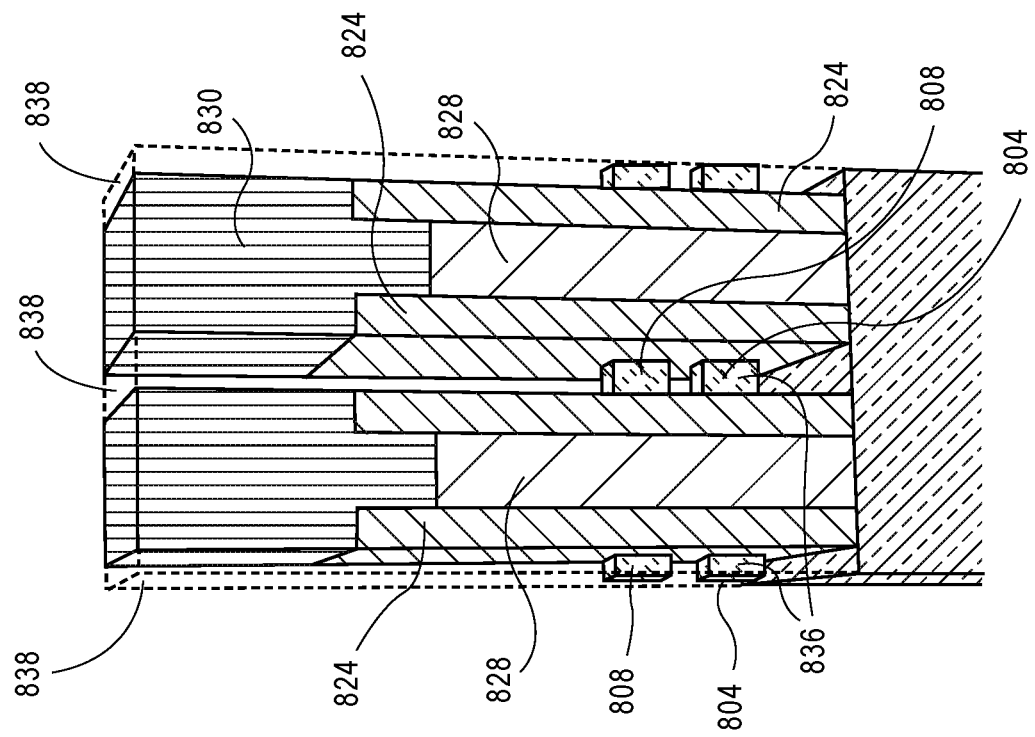
Figure 8I:
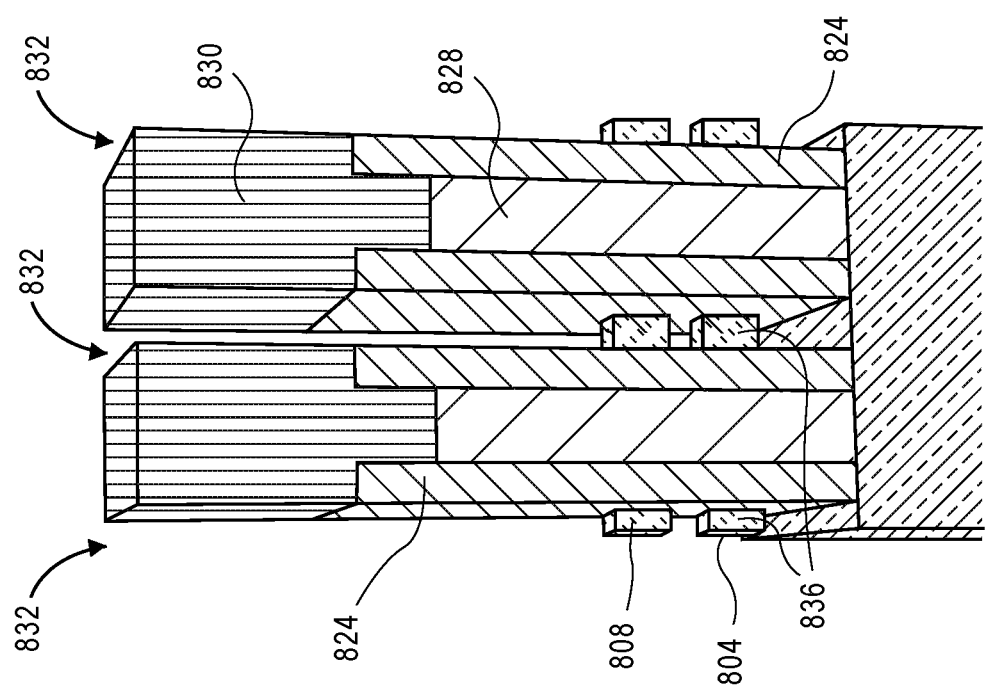

FIG. 8I illustrates the structure of FIG. 8H following formation of a gate dielectric layer 836 on the portions of the active wire-forming layers 804 and 808 in the channel regions 832. In an embodiment, the gate dielectric layer 836 is a high-k gate dielectric layer. In an embodiment, the gate dielectric layer 836 is formed by atomic layer deposition (ALD). In an embodiment, the gate dielectric layer 836 is formed selectively on the portions of the active wire-forming layers 804 and 808 in the channel regions 832. In another embodiment, however, the gate dielectric layer 836 is formed conformally on the structure of FIG. 8H.

FIG. 8J illustrates the structure of FIG. 8I following formation of permanent gate electrodes 838. Each of the permanent gate electrodes 838 completely surrounds the portions of the active wire-forming layers 804 and 808 in the channel regions 832. The permanent gate electrodes 838 may be formed by depositing a metal (or metal-containing material) or stack of metals (or stack metal-containing materials) in the channel regions 832. It is to be appreciated that further fabrication may involve formation of conductive contacts to source and drain structures 828 and/or to gate electrodes 838. In an embodiment, the completed device of FIG. 8J exhibits reduced parasitic capacitance due to presence of the cavity spacers 824.

Figure 9:
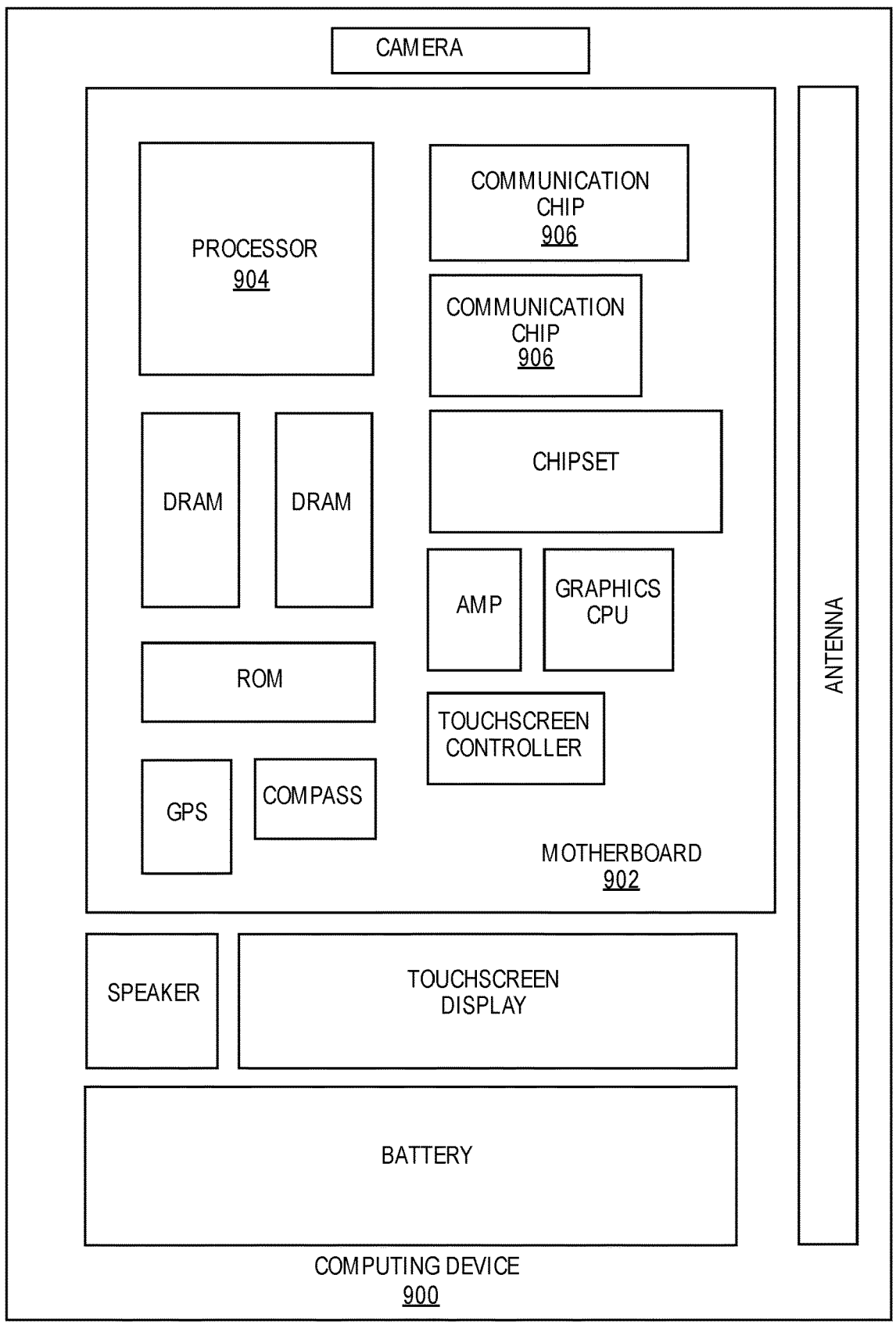
FIG. 9 illustrates a computing device in accordance with one implementation of embodiments of the disclosure.

FIG. 9 illustrates a computing device 900 in accordance with one implementation of embodiments of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 306 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more devices, such as MOS-FET transistors built in accordance with implementations of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the disclosure, the integrated circuit die of the communication chip includes one or more devices, such as MOS-FET transistors built in accordance with implementations of the disclosure.

In further implementations, another component housed within the computing device 900 may contain an integrated circuit die that includes one or more devices, such as MOS-FET transistors built in accordance with implementations of the disclosure.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 10:
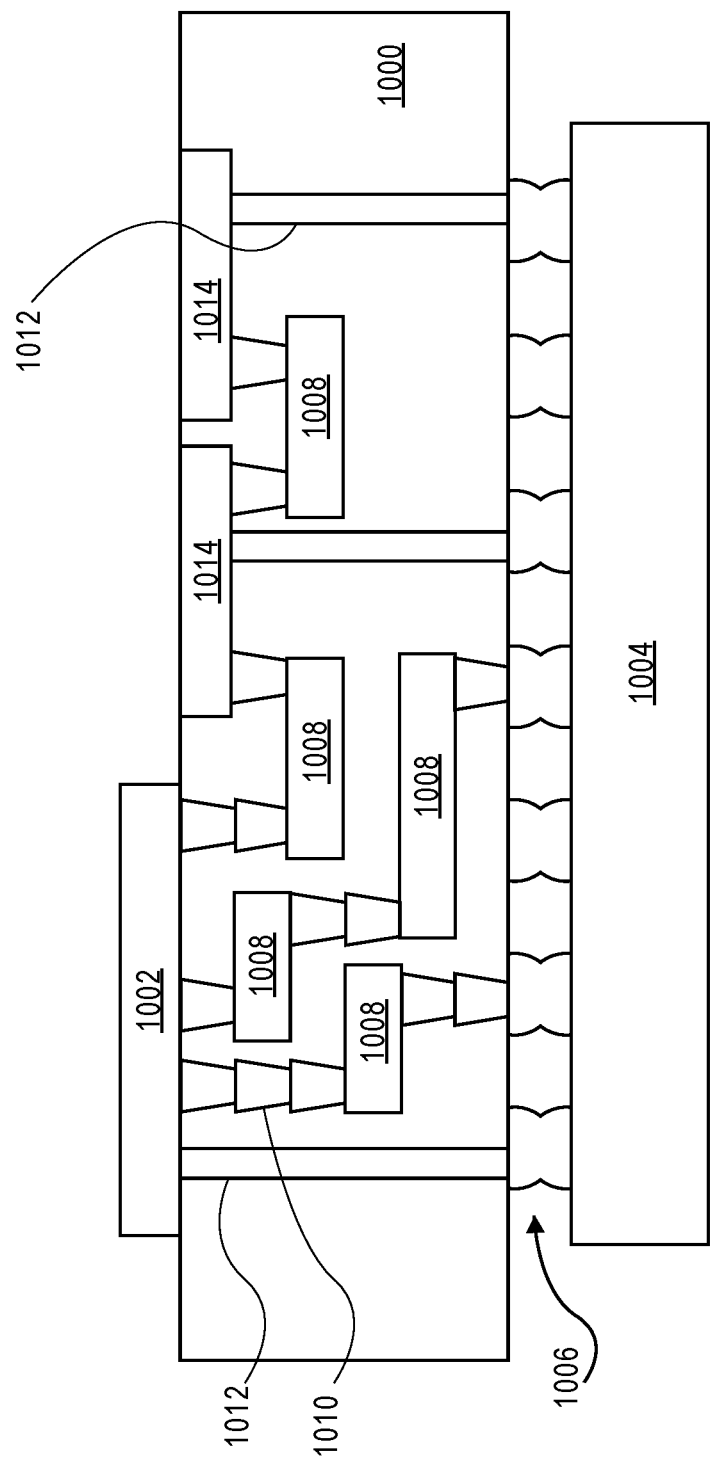
FIG. 10 is an interposer implementing one or more embodiments of the disclosure.

FIG. 10 is an interposer 1000 implementing one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000.

In other embodiments, the first and second substrates 1002/ 1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000.

Thus, embodiments of the present disclosure include semiconductor nanowire devices having (111)-plane channel sidewalls and methods of fabricating semiconductor nanowire devices having (111)-plane channel sidewalls.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor device of a first conductivity type. The semiconductor device of the first conductivity type includes a plurality of vertically stacked nanowires disposed above a substrate, each of the nanowires having a discrete channel region having <111> lateral sidewalls along a <110> carrier transport direction, a common gate electrode stack of the first conductivity type surrounding each of the discrete channel regions of the plurality of vertically stacked nanowires, and source and drain regions of the first conductivity type on either side of the discrete channel regions of the plurality of vertically stacked nanowires. The semiconductor structure also includes a semiconductor device of a second conductivity type opposite the first conductivity type. The second semiconductor device includes a semiconductor fin disposed above the substrate, the semiconductor fin having a channel region with a top and side surfaces, the channel region having <111> lateral sidewalls along a <110> carrier transport direction, a gate electrode stack of the second conductivity type disposed on the top and side surfaces of the channel region of the semiconductor fin, and source and drain regions of the second conductivity type on either side of the channel region of the semiconductor fin.

Example embodiment 2: The integrated circuit structure of example embodiment 1, wherein the plurality of vertically stacked nanowires is a plurality of vertically stacked nanowires of a first semiconductor material, and the semiconductor fin is a semiconductor fin of a second semiconductor material different from the first semiconductor material.

Example embodiment 3: The integrated circuit structure of example embodiment 2, wherein the first semiconductor material is silicon, and the second semiconductor material is InGaAs.

Example embodiment 4: The integrated circuit structure of example embodiment 1, 2 or 3, wherein the plurality of vertically stacked nanowires is a plurality of vertically stacked silicon nanowires.

Example embodiment 5: The integrated circuit structure of example embodiment 1, 2, 3 or 4, wherein the semiconductor fin is an InGaAs semiconductor fin.

Example embodiment 6: The integrated circuit structure of example embodiment 1, 2, 3, 4 or 5, wherein the source and drain regions of the first conductivity type are a pair source and drain regions common to all of the discrete channel regions of the plurality of vertically stacked nanowires.

Example embodiment 7: The integrated circuit structure of example embodiment 1, 2, 3, 4 or 5, wherein the source and drain regions of the first conductivity type are a plurality of discrete source and drain region pairs each corresponding to a discrete channel region of one of the nanowires.

Example embodiment 8: The integrated circuit structure of example embodiment 1, 2, 3, 4, 5, 6 or 7, wherein the semiconductor structure further includes a first pair of dielectric spacers on either side of the common gate electrode stack of the first conductivity type, and a second pair of dielectric spacers on either side of the gate electrode stack of the second conductivity type.

Example embodiment 9: The integrated circuit structure of example embodiment 1, 2, 3, 4, 5, 6, 7 or 8, wherein the common gate electrode stack of the first conductivity type includes a first high-k gate dielectric layer disposed on and surrounding each of the discrete channel regions of the plurality of vertically stacked nanowires, and the gate electrode stack of the second conductivity type includes a second high-k gate dielectric layer disposed on the top and side surfaces of the channel region of the semiconductor fin.

Example embodiment 10: The integrated circuit structure of example embodiment 9, wherein the common gate electrode stack of the first conductivity type further includes a first metal gate disposed on the first high-k gate dielectric layer, and the gate electrode stack of the second conductivity type further includes a second metal gate disposed on the second high-k gate dielectric layer.

Example embodiment 11: The integrated circuit structure of example embodiment 1, 2, 3, 4, 5, 6, 7, 8, 9 or 10, wherein the semiconductor device of the first conductivity type is a PMOS semiconductor device, and the semiconductor device of the second conductivity type is an NMOS semiconductor device.

Example embodiment 12: An integrated circuit structure includes a plurality of vertically stacked silicon nanowires disposed above a substrate, each of the silicon nanowires including a discrete channel region having <111> lateral sidewalls along a <110> carrier transport direction. A common P-type gate electrode stack surrounds each of the discrete channel regions of the plurality of vertically stacked silicon nanowires. A pair of dielectric spacers is on either side of the common P-type gate electrode stack, each of the pair of dielectric spacers including a continuous material disposed along a sidewall of the common P-type gate electrode and surrounding a discrete portion of each of the vertically stacked silicon nanowires. A pair of source and drain regions is on either side of the pair of dielectric spacers.

Example embodiment 13: The integrated circuit structure of example embodiment 12, wherein an uppermost surface of the pair of dielectric spacers is below an uppermost surface of the common P-type gate electrode stack.

Example embodiment 14: The integrated circuit structure of example embodiment 13, wherein the pair of source and drain regions has an uppermost surface below the uppermost surface of the pair of dielectric spacers.

Example embodiment 15: The integrated circuit structure of example embodiment 12, 13 or 14, wherein the pair of source and drain regions is a pair of common source and drain regions coupled to the plurality of vertically stacked silicon nanowires.

Example embodiment 16: The integrated circuit structure of example embodiment 15, wherein the substrate is a single crystalline semiconductor substrate, and the pair of common source and drain regions is a pair of epitaxial semiconductor regions further coupled to an exposed portion of the single crystalline semiconductor substrate.

Example embodiment 17: The integrated circuit structure of example embodiment 15, wherein the semiconductor device further includes a pair of conductive contacts disposed on the pair of common source and drain regions.

Example embodiment 18: The integrated circuit structure of example embodiment 12, 13, 14, 15, 16 or 17, wherein the common P-type gate electrode stack includes a high-k gate dielectric layer disposed on and surrounding each of the discrete channel regions of the plurality of vertically stacked silicon nanowires.

Example embodiment 19: The integrated circuit structure of example embodiment 18, wherein the common P-type gate electrode stack further includes a metal gate disposed on the high-k gate dielectric layer.

Example embodiment 20: An integrated circuit structure includes a plurality of vertically stacked silicon nanowires disposed above a substrate, each of the silicon nanowires having a discrete channel region having <111> lateral sidewalls along a <110> carrier transport direction. A common P-type gate electrode stack surrounds each of the discrete channel regions of the plurality of vertically stacked silicon nanowires. P-type source and drain regions are on either side of the discrete channel regions of the plurality of vertically stacked silicon nanowires.

Example embodiment 21: The integrated circuit structure of example embodiment 20, wherein the P-type source and drain regions are a pair source and drain regions common to all of the discrete channel regions of the plurality of vertically stacked silicon nanowires.

Example embodiment 22: The integrated circuit structure of example embodiment 20, wherein the P-type source and drain regions are a plurality of discrete source and drain region pairs each corresponding to a discrete channel region of one of the silicon nanowires.

Example embodiment 23: The integrated circuit structure of example embodiment 20, 21 or 22, wherein the semiconductor structure further includes a pair of dielectric spacers on either side of the common P-type gate electrode stack.

Example embodiment 24: The integrated circuit structure of example embodiment 20, 21, 22 or 23, wherein the common P-type gate electrode stack includes a high-k gate dielectric layer disposed on and surrounding each of the discrete channel regions of the plurality of vertically stacked silicon nanowires.

Example embodiment 25: The integrated circuit structure of example embodiment 24, wherein the common P-type gate electrode stack further includes a metal gate disposed on the high-k gate dielectric layer.

What is claimed is:

1. An integrated circuit structure, comprising:
   a semiconductor device of a first conductivity type, comprising:
      a plurality of vertically stacked nanowires disposed above a substrate, each of the nanowires comprising a discrete channel region having <111> lateral sidewalls along a <110> carrier transport direction;
      a common gate electrode stack of the first conductivity type surrounding each of the discrete channel regions of the plurality of vertically stacked nanowires; and
      source and drain regions of the first conductivity type on either side of the discrete channel regions of the plurality of vertically stacked nanowires; and
   a semiconductor device of a second conductivity type opposite the first conductivity type, the semiconductor device of the second conductivity type comprising:
      a semiconductor fin disposed above the substrate, the semiconductor fin having a channel region with a top and side surfaces, the channel region having <111> lateral sidewalls along a <110> carrier transport direction, wherein the <111> lateral sidewalls are substantially vertical sidewalls;
      a gate electrode stack of the second conductivity type disposed on the top and side surfaces of the channel region of the semiconductor fin; and
      source and drain regions of the second conductivity type on either side of the channel region of the semiconductor fin.

2. The integrated circuit structure of claim 1, wherein the plurality of vertically stacked nanowires is a plurality of vertically stacked nanowires of a first semiconductor material, and wherein the semiconductor fin is a semiconductor fin of a second semiconductor material different from the first semiconductor material.

3. The integrated circuit structure of claim 2, wherein the first semiconductor material is silicon, and the second semiconductor material is InGaAs.

4. The integrated circuit structure of claim 1, wherein the plurality of vertically stacked nanowires is a plurality of vertically stacked silicon nanowires.

5. The integrated circuit structure of claim 1, wherein the semiconductor fin is an InGaAs semiconductor fin.

6. The integrated circuit structure of claim 1, wherein the source and drain regions of the first conductivity type are a pair source and drain regions common to all of the discrete channel regions of the plurality of vertically stacked nanowires.

7. The integrated circuit structure of claim 1, wherein the source and drain regions of the first conductivity type are a plurality of discrete source and drain region pairs each corresponding to a discrete channel region of one of the nanowires.

8. The integrated circuit structure of claim 1, further comprising:
   a first pair of dielectric spacers on either side of the common gate electrode stack of the first conductivity type; and a second pair of dielectric spacers on either side of the gate electrode stack of the second conductivity type.

9. The integrated circuit structure of claim 1, wherein the common gate electrode stack of the first conductivity type comprises a first high-k gate dielectric layer disposed on and surrounding each of the discrete channel regions of the plurality of vertically stacked nanowires, and the gate electrode stack of the second conductivity type comprises a second high-k gate dielectric layer disposed on the top and side surfaces of the channel region of the semiconductor fin.

10. The integrated circuit structure of claim 9, wherein the common gate electrode stack of the first conductivity type further comprises a first metal gate disposed on the first high-k gate dielectric layer, and the gate electrode stack of the second conductivity type further comprises a second metal gate disposed on the second high-k gate dielectric layer.

11. The integrated circuit structure of claim 1, wherein the semiconductor device of the first conductivity type is a PMOS semiconductor device, and the semiconductor device of the second conductivity type is an NMOS semiconductor device.

12. The integrated circuit structure of claim 1, wherein each of the nanowires has a rounded surface.

* * * * *